United States Patent
Lee et al.

(10) Patent No.: US 11,271,032 B2
(45) Date of Patent: Mar. 8, 2022

(54) DISPLAY DEVICE

(71) Applicant: Samsung Display Co., Ltd., Yongin-si (KR)

(72) Inventors: Yu Jin Lee, Suwon-si (KR); Kyung Bae Kim, Seongnam-si (KR); Ji Hye Lee, Hwaseong-si (KR); Chong Chui Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

(21) Appl. No.: 16/901,850

(22) Filed: Jun. 15, 2020

(65) Prior Publication Data
US 2020/0403030 A1 Dec. 24, 2020

(30) Foreign Application Priority Data

Jun. 20, 2019  (KR) .................. 10-2019-0073659
May 13, 2020  (KR) .................. 10-2020-0057033

(51) Int. Cl.
  H01L 27/15 (2006.01)
  H01L 33/38 (2010.01)
  H01L 33/62 (2010.01)
(52) U.S. Cl.
  CPC ............ H01L 27/156 (2013.01); H01L 33/38 (2013.01); H01L 33/62 (2013.01); *H01L 2933/0066* (2013.01)
(58) Field of Classification Search
  CPC ....... H01L 27/156; H01L 33/38; H01L 33/62; H01L 2933/0066; H01L 33/0095;
  (Continued)

(56) References Cited

U.S. PATENT DOCUMENTS

2009/0109668 A1* 4/2009 Isobe ................. F21K 9/90
                                        362/231
2014/0197433 A1* 7/2014 Ishizaki ............. H01L 33/60
                                        257/91
(Continued)

FOREIGN PATENT DOCUMENTS

KR  10-2017-0084139 A  7/2017
KR  10-2017-0094930 A  8/2017
(Continued)

*Primary Examiner* — Victor A Mandala
(74) *Attorney, Agent, or Firm* — Lewis Roca Rothgerber Christie LLP

(57) ABSTRACT

A display device is provided. The display device includes a first electrode including a first electrode surface extending in a first direction and a second electrode surface connected to one end of the first electrode surface and extending in a second direction that is different from the first direction, a second electrode including a third electrode surface extending in the first direction and spaced apart from the first electrode surface and facing the first electrode surface, and a fourth electrode surface extending in the second direction and spaced apart from the second electrode surface and facing the second electrode surface, and at least one light emitting element between the first electrode and the second electrode and including a first light emitting element between the first electrode surface and the third electrode surface and a second light emitting element between the second electrode surface and the fourth electrode surface.

27 Claims, 17 Drawing Sheets

(58) Field of Classification Search
CPC . H01L 33/20; H01L 25/0753; H01L 27/3246; H01L 27/3248; H01L 27/3279
See application file for complete search history.

(56) References Cited

U.S. PATENT DOCUMENTS

| | | | | |
|---|---|---|---|---|
| 2014/0239318 A1* | 8/2014 | Oyu | ........................ | H01L 24/82 257/88 |
| 2014/0346536 A1* | 11/2014 | Sugiura | ................... | H01L 33/56 257/88 |
| 2018/0012876 A1* | 1/2018 | Kim | ...................... | H01L 25/167 |
| 2018/0019369 A1* | 1/2018 | Cho | ........................ | H01L 33/62 |
| 2018/0182818 A1* | 6/2018 | Kim | ...................... | G06F 3/0446 |
| 2019/0326348 A1* | 10/2019 | Im | ............................. | G09G 3/32 |
| 2020/0013766 A1* | 1/2020 | Kim | ...................... | H01L 25/167 |
| 2020/0203587 A1 | 6/2020 | Kim et al. | | |
| 2020/0388597 A1* | 12/2020 | Chaji | ..................... | H01L 33/60 |
| 2021/0167050 A1* | 6/2021 | Cho | ........................ | H01L 33/44 |
| 2021/0202451 A1* | 7/2021 | Kong | ................... | H01L 33/0062 |
| 2021/0210666 A1* | 7/2021 | Do | .......................... | H01L 24/95 |
| 2021/0265324 A1* | 8/2021 | Kong | ................... | H01L 25/167 |
| 2021/0273131 A1* | 9/2021 | Kang | .................. | H01L 25/0753 |
| 2021/0280746 A1* | 9/2021 | Kim | ................... | H01L 25/0753 |
| 2021/0288033 A1* | 9/2021 | Lim | ..................... | H01L 25/0753 |
| 2021/0288220 A1* | 9/2021 | Oh | ........................ | H01L 25/167 |
| 2021/0296550 A1* | 9/2021 | Li | .......................... | H01L 27/156 |
| 2021/0305222 A1* | 9/2021 | Min | ..................... | H01L 33/405 |
| 2021/0320231 A1* | 10/2021 | Kim | ..................... | H01L 25/167 |

FOREIGN PATENT DOCUMENTS

| | | |
|---|---|---|
| KR | 10-1782889 B1 | 9/2017 |
| KR | 10-2017-0141305 A | 12/2017 |
| KR | 10-2018-0077114 A | 7/2018 |
| KR | 10-2020-0010701 A | 1/2020 |
| KR | 10-2020-0078398 A | 7/2020 |

* cited by examiner

DISPLAY DEVICE

CROSS-REFERENCE TO RELATED APPLICATION

This application claims priority to, and the benefit of, Korean Patent Application No. 10-2019-0073659 filed on Jun. 20, 2019 and No. 10-2020-0057033 filed on May 13, 2020 in the Korean Intellectual Property Office, which is hereby incorporated by reference for all purposes as if fully set forth herein.

BACKGROUND

1. Field

The present disclosure relates to a display device, and to a method of manufacturing the same.

2. Description of the Related Art

The importance of a display device has increased with the development of multimedia. Accordingly, various types of display devices, such as an organic light emitting display (OLED) and a liquid crystal display (LCD), have been used.

A display device for displaying an image includes a display panel, such as an organic light emitting display panel or a liquid crystal display panel. Among display panels, an organic light emitting display panel includes an organic light emitting element, such as a light emitting diode (LED). The light emitting diode (LED) includes an organic light emitting diode (OLED) using an organic material as a fluorescent material, and an inorganic light emitting diode using an inorganic material as a fluorescent material.

SUMMARY

An aspect of the present disclosure is to provide a display device that includes a plurality of electrodes extending in different directions from each other, and in which light emitting elements located between the electrodes are aligned in various directions.

Another aspect of the present disclosure is to provide a display device that emits light in various directions without fixing the emission direction of light emitted from light emitting elements.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

The effects of the present disclosure are not limited to the above-described effects, and other effects that are not described herein will become apparent to those skilled in the art from the following description.

According to an embodiment of the present disclosure, a display device includes a first electrode including a first electrode surface extending in a first direction and a second electrode surface connected to one end of the first electrode surface and extending in a second direction that is different from the first direction, a second electrode including a third electrode surface extending in the first direction and spaced apart from the first electrode surface and facing the first electrode surface, and a fourth electrode surface extending in the second direction and spaced apart from the second electrode surface and facing the second electrode surface, and at least one light emitting element between the first electrode and the second electrode and including a first light emitting element between the first electrode surface and the third electrode surface and a second light emitting element between the second electrode surface and the fourth electrode surface.

The light emitting element may have a shape extending in one direction, wherein a first angle, which is an acute angle between a long axis of the first light emitting element and the first direction, is different from a second angle, which is an acute angle between a long axis of the second light emitting element and the first direction.

The first angle may be greater than the second angle.

The first electrode may further include a fifth surface that is connected to the other end of the first electrode surface and that extends in a third direction that is different from the first direction and the second direction, the second electrode may further include a sixth surface that is connected to the other end of the third electrode surface, that extends in the third direction, that is spaced apart from the fifth surface, and that faces the fifth surface, and the light emitting element may further include a third light emitting element between the fifth surface and the sixth surface.

A third angle, which is an acute angle between a long axis of the third light emitting element and the first direction, may be smaller than the first angle.

Directions of the long axes of the first light emitting element, the second light emitting element, and the third light emitting element cross each other.

The display device may further include a first contact electrode contacting one end of the first light emitting element and the first electrode surface of the first electrode, and a second contact electrode contacting the other end of the first light emitting element and the third electrode surface of the second electrode.

The first contact electrode may extend from a portion in which the first electrode surface is connected to the second electrode surface in the second direction to be in contact with the second electrode surface and one end of the second light emitting element.

The third electrode surface of the second electrode may be connected to the fourth electrode surface of the second electrode, and the second contact electrode may extend from a portion in which the third electrode surface is connected to the fourth electrode surface in the second direction to be in contact with the fourth electrode surface and the other end of the second light emitting element.

The second electrode may include a first fragment including the third electrode surface, and a second fragment spaced apart from the first fragment and including the fourth electrode surface.

The display device may further include a third contact electrode contacting one end of the second light emitting element and the second electrode surface of the first electrode, and a fourth contact electrode contacting the other end of the second light emitting element and the fourth electrode surface of the second fragment.

According to another embodiment of the present disclosure, a display device includes a first electrode including a first electrode extension portion extending in a first direction, and a first electrode expansion portion formed by expanding at least a portion of the first electrode extension portion, a second electrode including a second electrode extension portion extending in the first direction to be spaced apart from the first electrode extension portion and to face the first electrode extension portion, and a second electrode bending portion formed by bending at least a portion of the second electrode extension portion to be spaced apart from the first electrode expansion portion and to face the first electrode expansion portion, and at least one light emitting element between the first electrode expansion portion and the second electrode bending portion, and having a shape such that a direction of a long axis of the at least one light emitting element crosses a direction of a long axis of another light emitting element.

The first electrode expansion portion may include a first electrode surface extending in the first direction, and a second electrode surface extending in a second direction that is different from the first direction, the second electrode bending portion may include a third electrode surface spaced apart from the first electrode surface and facing the first electrode surface, and a fourth electrode surface spaced apart from the second electrode surface and facing the second electrode surface, and the at least one light emitting element may include a first light emitting element between the first electrode surface and the third electrode surface, and a second light emitting element between the second electrode surface and the fourth electrode surface.

The display device may further include a first contact electrode contacting the first electrode expansion portion and one end of the first light emitting element, and a second contact electrode contacting the second electrode bending portion and the other end of the first light emitting element.

The display device may further include a third electrode between the first electrode expansion portion and the second electrode bending portion, and a fourth electrode between the third electrode and the second electrode bending portion, wherein the third electrode includes a plurality of third electrode fragments spaced apart from each other in the first direction, and wherein the fourth electrode includes a plurality of fourth electrode fragments spaced apart from each other in the first direction.

The light emitting element may include a third light emitting element between the first electrode expansion portion and one of the third electrode fragments, a fourth light emitting element between the third electrode fragment and one of the fourth electrode fragments, and a fifth light emitting element between the fourth electrode fragment and the second electrode bending portion.

The third electrode fragments may include a first sub-fragment spaced apart from, and facing, the first electrode surface of the first electrode expansion portion, and a second sub-fragment spaced apart from, and facing, the second electrode surface, and the at least one light emitting element may include a sixth light emitting element between the first electrode surface and the first sub-fragment, and a seventh light emitting element between the second electrode surface and the second sub-fragment.

The display device may further include a third contact electrode contacting the first sub-fragment and one end of the sixth light emitting element, and a fourth contact electrode contacting the second sub-fragment and one end of the seventh light emitting element, wherein the third contact electrode is spaced apart from the fourth contact electrode in the first direction.

According to the other embodiment of the present disclosure, a display device includes a plurality of pixels in each which at least one light emitting area is defined, and including a first electrode including a first electrode extension portion extending in a first direction, and a first electrode expansion portion formed by expanding at least a portion of the first electrode extension portion, a second electrode including a second electrode extension portion extending in the first direction to be spaced apart from, and to face, the first electrode extension portion, and a second electrode bending portion formed by bending at least a portion of the second electrode extension portion to be spaced apart from, and to face, the first electrode expansion portion, and a first light emitting element and a second light emitting element between the first electrode expansion portion and the second electrode bending portion, and each having a long axis respectively extending in directions crossing each other, wherein the plurality of pixels include a first pixel including a first light emitting area, and a second pixel adjacent to the first pixel and including a second light emitting area and a third light emitting area spaced apart from each other in the first direction.

The second electrode may include a second electrode stem extending in a second direction crossing the first direction, wherein the second electrode extension portions of the first light emitting area and the second light emitting area are branched from the second electrode stem, and wherein the second electrode extension portions of the second light emitting area and the third light emitting area are connected to each other.

The first electrode expansion portion may comprise a first electrode surface extending in the first direction and a second electrode surface extending in a second direction that is different from the first direction, wherein the second electrode bending portion may comprise a third electrode surface facing the first electrode surface and a fourth electrode surface facing the second electrode surface, and wherein the at least one light emitting element may comprise a first light emitting element between the first electrode surface and the third electrode surface and a second light emitting element between the second electrode surface and the fourth electrode surface.

The display device may further comprise: a partition wall surrounding the light emitting area of each of the pixels and comprising an opening area exposing the light emitting area, wherein the second electrode extension portion and the second electrode bending portion may be disposed between the first electrode and the partition wall.

The partition wall may be disposed between the neighboring pixels, and may comprise a partition wall extension portion extending in the first direction and corresponding to the first electrode surface of the first electrode expansion portion and a partition wall bending portion extending in the second direction and corresponding to the second electrode surface of the first electrode expansion portion.

The partition wall extension portion and the partition wall bending portion may be disposed between the second light emitting area and third light emitting area of the second pixel and between the second light emitting area of the second pixel and the first light emitting area of the first pixel.

The opening area may comprise a first opening portion in which the first electrode extension portion is disposed, a second opening portion in which the first electrode expansion portion is disposed and a width of which in the second direction is greater than a width of the first opening portion in the second direction, and a third opening portion which connects the first portion and the second opening portion and a width of which becomes narrower along the first direction, and the partition wall extension portion may be disposed corresponding to the second opening portion of the opening area, and the partition wall bending portion may be disposed corresponding to the third opening portion of the opening area.

The partition wall may comprise a first opening area exposing the first light emitting area of the first pixel and a second opening area exposing the second light emitting area and third light emitting area of the second pixel, and the first opening area may comprise one of the second opening portions, and the second opening area may include the plurality of second opening portions spaced apart from each other in the first direction.

In the plurality of pixels, the first pixels and the second pixels may be alternately arranged along the second direction, and the first opening areas and the second opening areas may also be alternately arranged along the second direction.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
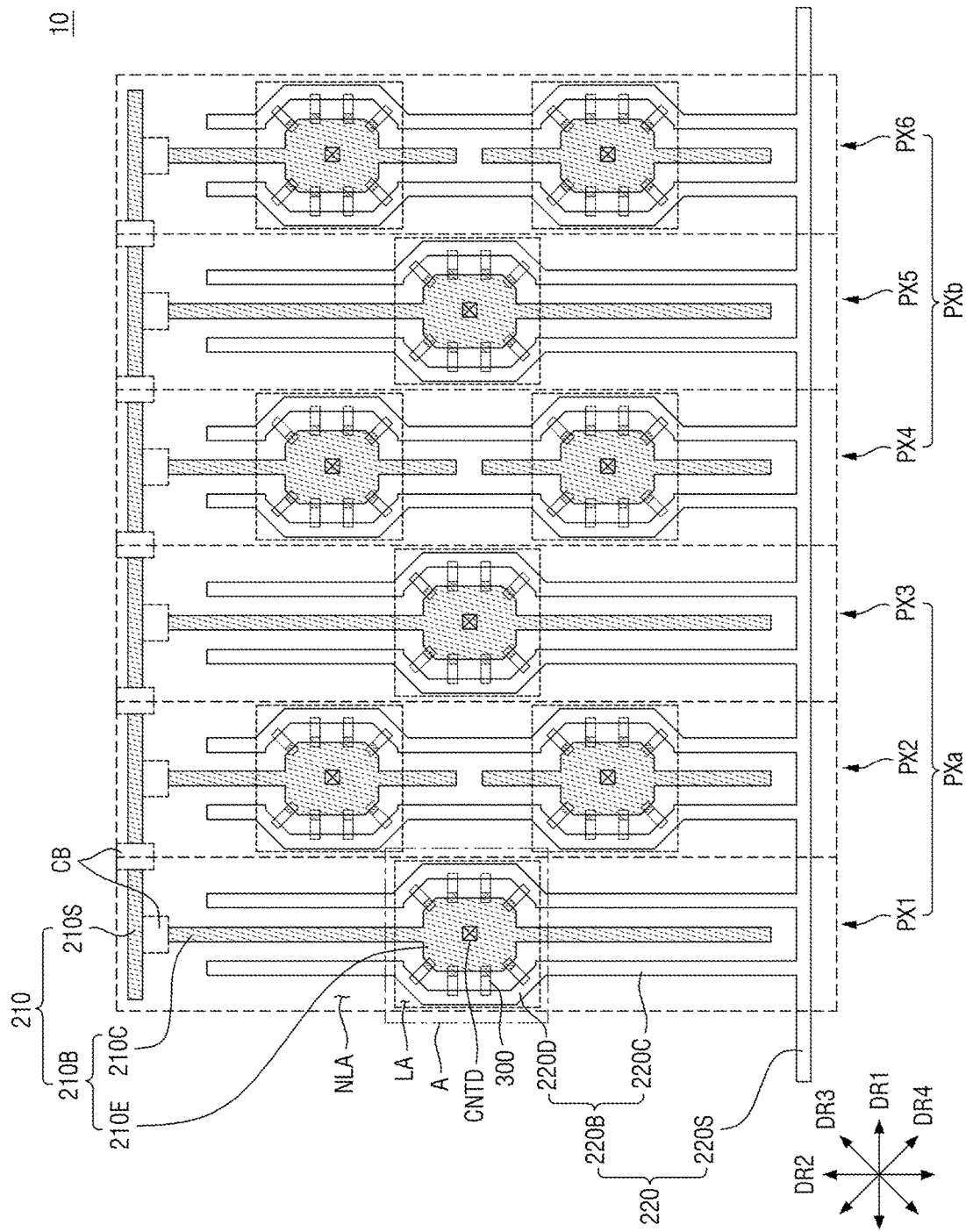
FIG. 1 is a plan view of a display device according to an embodiment.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display device according to an embodiment.

Referring to FIG. 1, a display device 10 may include a plurality of pixels PX. Each of the pixels PX includes at least one light emitting element 300 for emitting light of a given wavelength band to display a given color.

Each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. It is shown in FIG. 1 that the pixel PX includes three sub-pixels PXn, and two pixels PX include a total of six sub-pixels PXn. In an embodiment, the first sub-pixel PX1 and the fourth sub-pixel PX4 may emit red light of the first color, the second sub pixel PX2 and the fifth sub pixel PX5 may emit green light of the second color, and the third sub-pixel PX3 and the sixth sub-pixel PX6 may emit blue light of the third color. However, the present disclosure is not limited thereto, and the pixel PX may include a larger number of sub-pixels PXn. Further, in the display device 10, a plurality of pixels PX or sub-pixels PXn shown in FIG. 1 may be arranged in a first direction DR1 and a second direction DR2.

Each of the sub-pixels PXn of the display device 10 may include areas defined as a light emitting area LA or a non-light emitting area NLA. The light emitting area LA is defined as an area in which a light emitting element 300 included in the display device 10 is located to emit light of a given wavelength band. The non-light emitting area NLA, which is an area other than the light emitting area LA, is defined as an area in which no light emitting element 300 is located and no light is emitted.

In an embodiment, each of the sub-pixels PXn of the display device 10 may include at least one light emitting area LA. As shown in FIG. 1, each of the first sub-pixel PX1, the third sub-pixel PX3, and the fifth sub-pixel PX5 may include one light emitting area LA, and each of the second sub-pixel PX2, the fourth sub-pixel PX4, and the sixth sub-pixel PX6 may include two light emitting areas LA. Each of the pixels PX may include three sub-pixels PXn, and the pixels PX of the display device 10 may include different types of first-type pixels PXa and second-type pixels PXb.

For example, the first-type pixel PXa includes two sub-pixels PX1 and PX3 each having one light emitting area LA and one sub-pixel PX2 having two light emitting areas LA. The second-type pixel PXb includes one sub-pixel PX5 having one light emitting area LA and two sub-pixel PX4 and PX6 each having two light emitting areas LA. That is, the first-type pixel PXa may have four light emitting areas LA, the second-type pixel PXb may have five light emitting areas LA, and the display device 10 may be provided with a plurality of unit pixels each having the first-type pixel PXa and the second-type pixel PXb.

When each sub-pixel PXn has one light emitting area LA, six sub-pixels PXn have six light emitting areas LA. However, in the display device 10 according to an embodiment, six sub-pixels PXn may have nine light emitting areas LA. That is, in the display device 10 according to an embodiment, some of the sub-pixels PXn may include a plurality of light emitting areas LA, and thus light emission efficiency per unit area can be improved.

As will be described later, a plurality of electrodes, for example, a first electrode 210 and a second electrode 220, are located in the light emitting area LA, and a plurality of light emitting elements are located therebetween. According to an embodiment, the respective light emitting elements 300 are located between the first electrode expansion portion 210E (shown in FIG. 2) of the first electrode 210 and the second electrode bending portion 220D (shown in FIG. 2) of the second electrode 220, and the light emitting elements 300 may be aligned in different directions. A plurality of light emitting elements 300 having different alignment directions are arranged in one light emitting area LA, and each light emitting area LA may have a light emitting direction according to the alignment direction of the light emitting element 300. Details thereof will be described later with reference to other drawings.

The sub-pixel PXn of the display device 10 may include a plurality of electrodes 210 and 220 and a plurality of light emitting elements 300. Further, the present disclosure is limited thereto, and the sub-pixel PXn may include many members not shown in FIG. 1, for example, a plurality of partition walls 400 and a plurality of insulating layers 510, 520, and 550.

The plurality of electrodes 210 and 220 may be electrically connected to the light emitting elements 300, and may receive a predetermined voltage to allow the light emitting elements to emit light. At least a portion of each of the electrodes 210 and 220 may be used in forming an electric field in the sub-pixel PXn in order to align light emitting elements 300.

The plurality of electrodes 210 and 220 may include a first electrode 210 and a second electrode 220. In an embodiment, the first electrode 210 may be a pixel electrode separated for each sub-pixel PXn, and the second electrode 220 may be a common electrode commonly connected along each sub-pixel PXn. One of the first electrode 210 and the second electrode 220 may be an anode electrode of the light emitting element 300, and the other thereof may be a cathode electrode of the light emitting element 300. However, the present disclosure is not limited thereto.

The first electrode 210 may include a first electrode stem 210S extending in a first direction (e.g., DR1), and may include a first electrode branch 210B branched from the first electrode stem 210S and extending in a second direction (e.g., DR2) crossing the first direction, and the second electrode 220 may include a second electrode stem 220S extending in the first direction, and may include a second electrode branch 220B branched from the second electrode stem 220S and extending in the second direction.

Both ends of the first electrode stem 210S of any one pixel are spaced and terminated between the respective sub-pixels PXn, and may be placed on the same straight line as the first electrode stem 210S of the adjacent sub-pixel (for example, adjacent in the first direction DR1 belonging to the same row). Thus, the first electrode stem 210S located in each sub-pixel PXn may apply different electrical signals to the first electrode branch 210B, and the first electrode branches 210B may be separately driven, respectively.

The first electrode branch 210B is branched from at least a portion of the first electrode stem 210S, and is spaced apart from the first electrode stem 210S and extends in the second direction DR2. The first electrode branch 210B may be branched from the first electrode stem 210S, but the region branched during the manufacturing process of the display device 10 may be disconnected along a cutting portion CB. The first electrode branch 210B may be connected to a circuit element layer through an electrode contact hole CNTD formed in the first electrode expansion portion 210E to be described later. That is, the first electrode stem 210S may be a floating electrode. The first electrode branch 210B may be terminated in a state of being spaced apart from the second electrode stem 220S located to face the first electrode stem 210S.

According to an embodiment, the first electrode branch 210B may include a first electrode extension portion 210C extending in the second direction DR2 and a first electrode expansion portion 210E formed by expanding at least a portion of the first electrode extension portion 210C.

The first electrode extension portion 210C may be an electrode extending in the direction branched from the first electrode stem 210S (e.g., in the second direction D2), and the first expansion portion 210E may be a region in which a portion of the first electrode extension portion 210C is expanded in width in a direction other than the second direction DR2, for example, in the first direction DR1. That is, the width of the first electrode expansion portion 210E may be greater than the width of the first electrode extension portion 210C. The first electrode expansion portion 210E may provide a region in which the light emitting element 300 is located, and the light emitting element 300 might not be located in the first electrode extension portion 210C. The first electrode expansion portion 210E may be electrically connected to a circuit element layer through an electrode contact hole CNTD to be described later, and may transmit electrical signals (e.g., predetermined electric signals) to the light emitting element 300.

Figure 2:
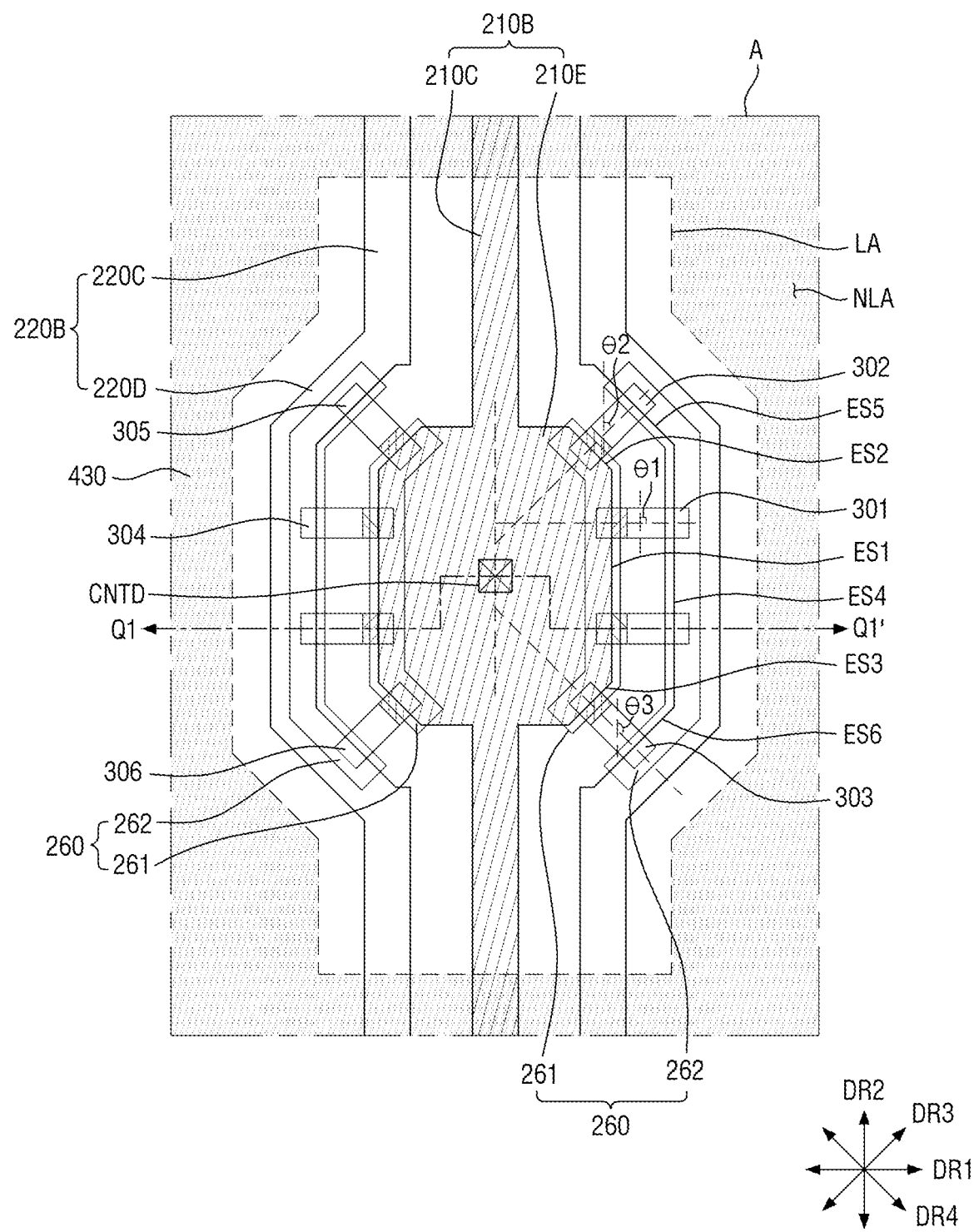
FIG. 2 is an enlarged view of the portion A of FIG. 1.

The first electrode expansion portion 210E is expanded to have a width (e.g., a predetermined width), thereby including a plurality of electrode surfaces ES (e.g., electrode surfaces ES1-ES3, shown in FIG. 2). Unlike the first electrode extension portion 210C, the first electrode expansion portion 210E may include one electrode surface ES extending in the second direction DR2, and another electrode surface ES extending in a different direction than the one electrode surface ES and the first electrode extension portion 210C. According to an embodiment, the light emitting elements 300, which each have one end located on the electrode surface ES of the first electrode expansion portion 210E, may be aligned with different orientations. Thus, in the first electrode expansion portion 210E, the light emitting element 300 may be located on the electrode surface ES, thereby forming the light emitting area LA of each sub-pixel PXn.

In some cases, a portion of the first electrode extension portion 210C may be disconnected. For example, in the case of the first sub-pixel PX1, the first sub-pixel PX1 includes one light emitting area LA, and thus one first electrode branch 210B may include one first electrode expansion portion 210E and one first electrode extension portion 210C. In the case of the second sub-pixel PX2, the second sub-pixel PX2 includes two light emitting areas LA, and thus one first electrode branch 210B may include two first electrode expansion portions 210E and two first electrode extension portions 210C.

Meanwhile, the first electrode branch 210B may not necessarily include the first electrode expansion portion 210E, and at least one first electrode branch 210B may be located for each sub-pixel PXn. Unlike FIG. 1, when the first electrode 210 includes one or more first electrode branches 210B, some of the first electrode branches 210b include the first electrode expansion portion 210E, whereas other first electrode branches 210B may omit the first electrode expansion portion 210E. Detailed descriptions thereof will be referred to other embodiments.

The second electrode 220 may include a second electrode stem 220S extending in the first direction DR1 and spaced apart from the first electrode branch 210S to face the first electrode branch 210S, and at least one second electrode branch 220B branched from the second electrode stem 220S, and extending in the second direction DR2. The second electrode stem 220S may extend to a plurality of sub-pixels PXn whose other ends are adjacent in the first direction DR1. Thus, both ends of the second electrode stem 220S of any one pixel may be connected to the second electrode stem 220S of respective adjacent pixels PX. In an embodiment, the second electrode stem 220S may be connected to the second electrode branch 220B of each sub-pixel PXn. The plurality of sub-pixels PXn may share one second electrode stem 220S with a neighboring sub-pixel PXn, and may receive the same electric signal. In other embodiments, the second electrode stem 220S may be electrically connected to a circuit element layer through another contact hole.

The second electrode branch 220B may be spaced apart from the first electrode branch 210b, and may face the first electrode branch 210b, and may be terminated in a state of being spaced apart from the first electrode stem 210S. One end of the second electrode branch 220B may be connected to the second electrode stem 220S, and the other end thereof may be located in the sub-pixel PXn in a state of being spaced apart from the first electrode stem 210S.

According to an embodiment, the second electrode branch 220B may include a second electrode extension portion 220C extending in the second direction DR2 and spaced apart from, and facing, the first electrode extension portion 210C, and also may include a second electrode bending portion 220D formed by bending at least a portion of the second electrode extension portion 220C, and which is spaced apart from, and facing, the first electrode expansion portion 210E.

One end of the second electrode extension portion 220C is connected to the second electrode stem 220S, and the other end thereof is spaced apart from the first electrode stem 210S and is terminated. The second electrode extension portion 220C is located to be spaced apart from and facing the first electrode extension portion 210C.

A portion of the second electrode extension portion 220C may be bent such that the second electrode bending portion 220D is spaced apart from, while facing, the electrode surface ES of the first electrode expansion portion 210E. The second electrode bending portion 220D may also include a plurality of electrode surfaces ES, and these electrode surfaces ES may be spaced apart from, while facing, the electrode surface ES of the first electrode expansion portion 210E. For example, the second electrode bending portion 220D may include an electrode surface extending in the second direction DR2 such that the second electrode bending portion 220D is spaced apart from and faces the electrode surface ES of the first electrode expansion portion 210E extending in the second direction DR2. Further, the second electrode bending portion 220D may include an electrode surface obtained by bending a portion of the second electrode extension portion 220C such that the second electrode bending portion 220D faces another electrode surface ES that extends in another direction (e.g., other than the second direction DR2). According to an embodiment, the light emitting elements 300, the other end of each of which is located on the electrode surface ES of the second electrode bending portion 220D, may be aligned with different orientations.

In an embodiment, the plurality of second electrode branches 220B are provided, and each of the second electrode branches 220B may include the second electrode bending portion 220D partially surrounding the outer electrode surface ES of the first electrode expansion portion 210E. It is shown in the drawings that two second electrode branches 220B are located in each sub-pixel PXn, and the first electrode branch 210b of each sub-pixel PXn is located between the two second electrode branches 220B. The first electrode branch 210b located between the two second electrode branches 220B may be located such that the first electrode expansion portion 210E is surrounded by the second electrode bending portion 220D. However, the present disclosure is not limited thereto. As described above, a larger number of first electrode branches 210b and a larger number of second electrode branches 220B may be located in each sub-pixel PXn.

The plurality of light emitting elements 300 may be respectively located between the first electrode branch 210B and the second electrode branches 220B, for example, between the first electrode expansion portion 210E and the second electrode bending portion 220D. In some of the plurality of light emitting elements 300, one end of the light emitting element 300 may be electrically connected to the first electrode expansion portion 210E, and the other end thereof may be electrically connected to the second electrode bending portion 220D.

The plurality of light emitting elements 300 are located to be spaced apart from each other, and the distances therebetween are not particularly limited. In some cases, the plurality of light emitting elements 300 are arranged adjacent to each other to form a group, and the other light emitting elements 300 may form a group in a state of being spaced apart at regular intervals, and may have non-uniform density, and may be aligned in one direction.

According to an embodiment, the plurality of light emitting elements 300 may have a shape in which a long axis across both ends extends in one direction, and respective directions in which the long axis of respective ones of the plurality of light emitting elements 300 extend may cross each other. The light emitting elements 300 may be located between the first electrode expansion portion 210E and the second electrode bending portion 220D, and respective electrode surfaces ES of the first electrode expansion portion 210E and the second electrode bending portion 220D may extend in different directions from each other. Both ends of the light emitting element 300 may be located between the first electrode expansion portion 210E and the second electrode bending portion 220D, and the direction in which the long axis of the light emitting element 300 extends may vary depending on the direction in which the electrode surfaces ES extend. The display device 10 according to an embodiment may be configured such that the plurality of light emitting elements 300, including the first electrode expansion portion 210E and the second electrode bending portion 220D, have different alignment directions with respect to each other.

Meanwhile, although not shown in FIG. 1, the display device 10 according to an embodiment may further include other members in addition to the plurality of electrodes 210 and 220 and the plurality of light emitting elements 300. Detailed descriptions thereof are referred to other drawings.

FIG. 2 is an enlarged view of the portion A of FIG. 1.

Referring to FIG. 2, the display device 10 according to an embodiment may include a plurality of contact electrodes 260 and a partition wall 400 (e.g., first to third partition walls 410, 420, and 430).

The contact electrodes 260 may be respectively located to partially overlap the first electrode expansion portion 210E and the second electrode bending portion 220D. In an embodiment, the contact electrode 260 may include a first contact electrode 261 contacting the first electrode expansion portion 210E and one end of the light emitting element 300, and a second contact electrode 262 contacting the second electrode bending portion 220D and the other end of the light emitting element 300.

The first contact electrode 261 may have a shape partially extending along the outer surface of the first electrode expansion portion 210E. The second contact electrode 262 may have a shape partially extending along the outer surface of the second electrode bending portion 220D. That is, in an embodiment, the first contact electrode 261 and the second contact electrode 262 include respective surfaces extending in the second direction DR2, and may include respective surfaces extending in a direction other than the second direction DR2. The first contact electrode 261 and the second contact electrode 262 may be spaced apart from each other, and may respectively transmit an electric signal received from each of the electrodes 210 and 220 to the light emitting element 300. However, the present disclosure is not limited thereto, and the display device 10 may include a larger number of contact electrodes 260. Also, the contact electrode 260 may be partially cut, and the cut portions may be spaced apart from each other.

Each sub-pixel PXn may include at least one partition wall 400. Although FIG. 2 shows only a third partition wall 430 located to surround the light emitting area LA, the display device 10 according to an embodiment may further include a first partition wall 410 (shown in FIG. 4) and a second partition wall 420 (shown in FIG. 4), which are respectively located under the first electrode expansion portion 210E and the second electrode bending portion 220D. First, the third partition wall 430 will be described with reference to FIG. 2.

The third partition wall 430 may be located to surround the light emitting area LA of each sub-pixel PXn. The third partition wall 430 may be formed to distinguish the light emitting area LA from the non-light emitting area NLA, and the plurality of light emitting elements 300 may be located only in the light emitting area LA in the process of manufacturing the display device 10. Some areas of the first electrode 210 and the second electrode 220, that is, a part of the first electrode stem 210S, a portion of the second electrode stem 220S, a portion of the first electrode extension portion 210C, and a portion of the second electrode extension portion 220C, may be located on the third partition wall 430. However, the present invention is not limited thereto. In some embodiments, when each of the electrodes 210 and 220 is formed first, the third partition wall 430 is disposed on the electrodes 210 and 220, and they may partially overlap each other.

Meanwhile, the third partition wall 430 is entirely disposed on each of the sub-pixels PXn, but may include opening areas ('QA1, QA2, and QA3' of FIG. 6) exposed by the light emitting area LA and disposed to surround the light emitting area LA. The shape of the opening area of the third partition wall 430 may have a structure corresponding to the shape of the light emitting area LA or each of the electrodes 210 and 220 disposed in each sub-pixel PXn. Details of the opening area of the third partition wall 430 will be described later with reference to other drawings.

The first partition wall 410 and the second partition wall 420 may be formed to substantially overlap some regions of the first electrode branch 210б and the second electrode branch 220B. For example, the first partition wall 410 may be located to overlap some regions of the first electrode expansion portion 210E and the first electrode extension portion 210C, and the second partition wall 420 may be located to overlap some regions of the second electrode bending portion 220D and the second electrode extension portion 220C. The first partition wall 410 and the second partition wall 420 may be formed to have substantially the same shapes as those components that are respectively overlapped, and may protrude upward. Thus, the regions of the first electrode 210 and the second electrode 220, overlapping the first partition wall 410 and the second partition wall 420, may protrude to have a thickness (e.g., a predetermined thickness). The first partition wall 410 and the second partition wall 420 may function as reflective partition walls such that light emitted from the light emitting element 300 located between the first electrode 210 and the second electrode 220 is reflected upward. Details of the plurality of partition walls 400 will be described later with reference to cross-sectional views.

Meanwhile, as described above, the plurality of light emitting elements 300 may be arranged to have different alignment directions. The display device 10 according to an embodiment includes the light emitting elements 300 having various alignment directions, thereby improving the visibility of the display device 10 depending on the alignment direction.

Figure 3:
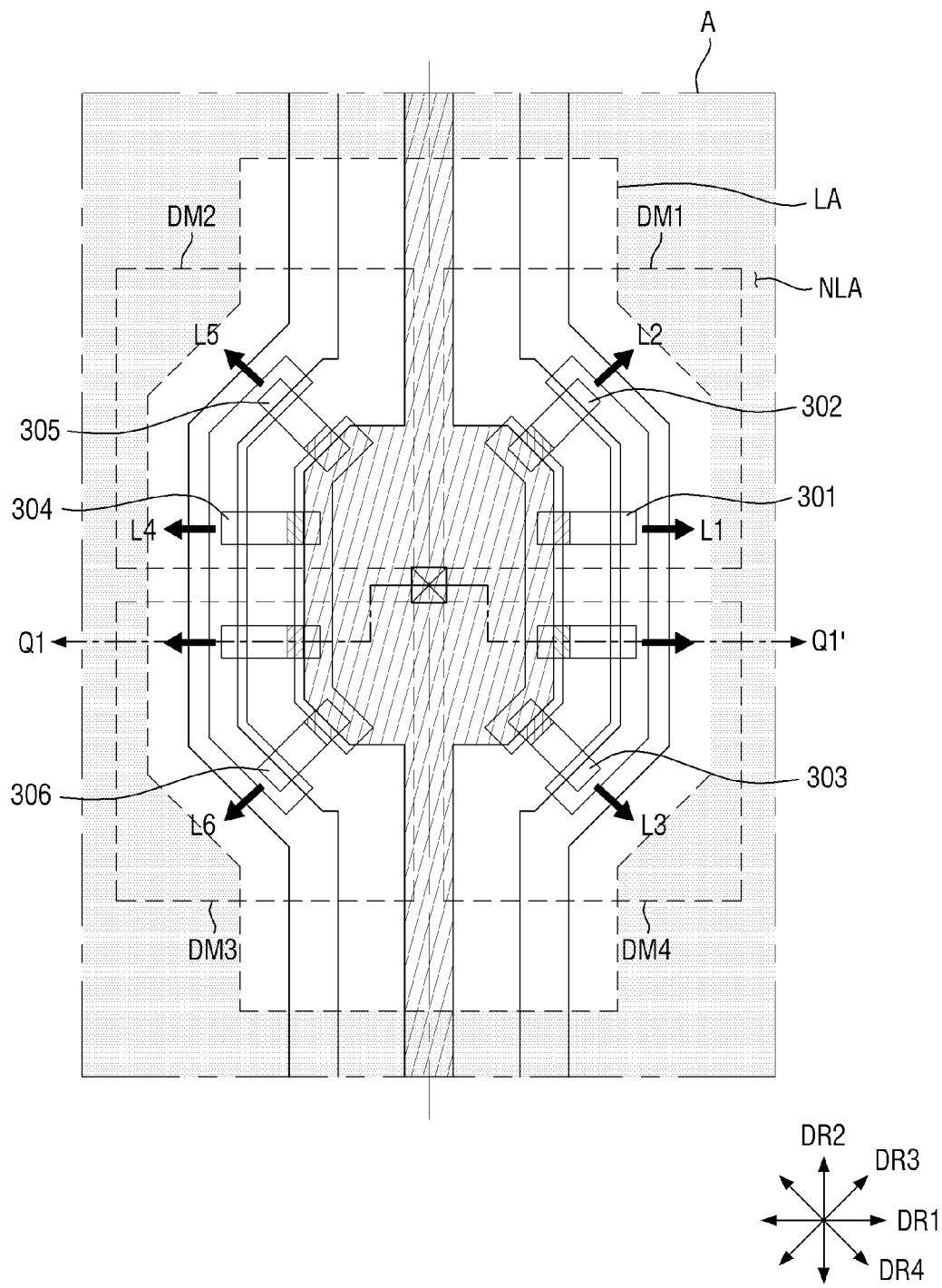
FIG. 3 is a schematic view showing the emission direction of light emitted from light emitting elements included in the display device according to an embodiment.

FIG. 3 is a schematic view showing the emission direction of light emitted from light emitting elements included in the display device according to an embodiment.

Referring to FIG. 3 together with FIGS. 1 and 2, each of the first electrode expansion portion 210E and the second electrode bending portion 220D according to an embodiment may include at least one electrode surface ES. The first electrode expansion portion 210E may include a first electrode surface ES1 extending in the second direction DR2, and a second electrode surface ES2 and a third electrode surface ES3 connected to respective ends of the first electrode surface ES1 and extending in respective directions that are different from the second direction DR2. The second electrode surface ES2 extends in a fourth direction DR4, which is a direction between the second direction DR2 and one side of the first direction DR1, and the third electrode surface ES3 extends in a third direction DR3, which is a direction between the second direction DR2 and the other side of the first direction DR1.

The second electrode bending portion 220D may include a fourth electrode surface ES4 extending in the second direction DR2, spaced apart from the first electrode surface ES1 and facing the first electrode surface ES1, and a fifth electrode surface ES5 and a sixth electrode surface ES6 connected to respective ends of the fourth electrode surface ES4 and extending in respective directions that are different from the second direction DR2. The fifth electrode surface ES5 is spaced apart from the second electrode surface ES2, faces the second electrode surface ES2, and extends in the fourth direction DR4. The sixth electrode surface ES6 is spaced apart from the third electrode surface ES3, faces the third electrode surface ES3, and extends in the third direction DR3.

One end of the light emitting element 300 may be located on the first electrode expansion portion 210E, and the other end thereof may be located on the second electrode bending portion 220D. In an embodiment, the light emitting elements 300 may include a first light emitting element 301 located between the first electrode surface ES1 and the fourth electrode surface ES4, a second light emitting element 302 located between the second electrode surface ES2 and the fifth electrode surface ES5, and a third light emitting element 303 located between the third electrode surface ES3 and the sixth electrode surface ES6.

In the first light emitting element 301, the second light emitting element 302, and the third light emitting element 303, a long axis crossing both of respective ends may extend, and may be changed depending on the extending direction of each corresponding electrode ES. For example, the first light emitting element 301 may be located between the first electrode surface ES1 and the fourth electrode surface ES4 so that one end thereof faces the first direction DR1, the second light emitting element 302 may be located between the second electrode surface ES2 and the fifth electrode surface ES5 so that one end thereof faces the third direction DR3, and the third light emitting element 303 may be located between the third electrode surface ES3 and the sixth electrode surface ES6 so that one end thereof faces the fourth direction DR4.

The first light emitting element 301, the second light emitting element 302, and the third light emitting element 303 are located between the first electrode expansion portion 210E and one second electrode bending portion 220D. The fourth light emitting element 304, the fifth light emitting element 305, and the sixth light emitting element 306 are located between the first electrode expansion portion 210E and another second electrode bending portion 220D. The fourth light emitting element 304 may be aligned in the same direction as the first light emitting element 301, the fifth light emitting element 305 may be aligned in the same direction as the third light emitting element 303, and the sixth light emitting element 306 may be aligned in the same direction as the second light emitting element 302.

The light emitting element 300 to be described later with reference to FIG. 5 may include a plurality of conductive semiconductors and an active layer located therebetween, and light may be emitted from side surfaces of both ends thereof. In the display device 10 including the light emitting element 300, the emission direction of light emitted from the light emitting element 300 may vary depending on the alignment direction of the light emitting element 300. In the display device 10 according to an embodiment, the plurality of light emitting elements 300 may have different alignment directions from each other, thereby controlling the emission direction of light emitted from the display device 10. The first electrode expansion portion 210E includes electrodes surfaces ES extending in a plurality of respective directions instead of an electrode surface ES extending in only one direction, thereby allowing the light emitting elements 300 of the display device 10 to have various alignment directions. The first light emitting element 301 is oriented such that its long axis has a first angle $\Theta 1$, which is a right angle or an acute angle formed with respect to the second direction DR2, the second light emitting element 302 is oriented such that its long axis has a second angle $\Theta 2$, which is an acute angle formed with respect to the second direction DR2, and the third light emitting element 303 is oriented such that its long axis has a third angle $\Theta 3$, which is an acute angle formed with respect to the second direction DR2.

In an embodiment, the first angle $\Theta 1$ may have a larger value than the second angle $\Theta 2$. Because the long axis of the first light emitting element 301 is oriented in the first direction DR1, the first angle 81 may have a value substantially close to 90°. In contrast, because the long axis of the second light emitting element 302 and the third light emitting element 303 are oriented in the third direction DR3 and the fourth direction DR4, respectively, the second angle $\Theta 2$ and the third angle $\Theta 3$ have values that are smaller than 90°. The respective light emitting elements 300, for example, the first light emitting element 301, the second light emitting element 302, and the third light emitting element 303, may be aligned to be not in parallel with each other, and the extending directions of respective long axes thereof may cross each other.

Accordingly, the emission light L emitted from each light emitting element 300 may be emitted in various directions. First emission light L1 and fourth emission light L4 respectively emitted from the first light emitting element 301 and the fourth light emitting element 304 may be emitted in the first direction DR1 (e.g., in opposite directions with respect to the first direction DR1). Second emission light L2 and sixth emission light L6 respectively emitted from the second light emitting element 302 and the sixth light emitting element 306 may be emitted in the third direction DR3 (e.g., in opposite directions with respect to the third direction DR3). Third emission light L2 and fifth emission light L5 respectively emitted from the third light emitting element 303 and the fifth light emitting element 305 may be emitted in the fourth direction DR4 (e.g., in opposite directions with respect to the fourth direction DR4).

In the display device 10 according to an embodiment, light may be emitted from the light emitting area LA of each sub-pixel PXn in various directions. For example, the light emitting area LA of each sub-pixel PXn may include a plurality of domains DM depending on the alignment direction of the corresponding light emitting elements 300. The domains DM may include a first domain DM1 located at one side of the light emitting area LA in the third direction DR3 based on the center of the light emitting area LA, a second domain DM2 located at one side of the light emitting area LA in the fourth direction DR4 based on the center of the light emitting area LA, a third domain DM3 located at the other side of the light emitting area LA in the third direction DR3 based on the center of the light emitting area LA, and a fourth domain DM4 located at the other side of the light emitting area LA in the fourth direction DR4 based on the center of the light emitting area LA.

The light emitting elements 300 aligned in different directions are located in a respective domain DM, and may be aligned in a direction in which each corresponding domain DM is located, to thereby emit light. Because the first electrode 210 includes the first electrode expansion portion 210E, the light emitting element 300 may have various alignment directions according to the direction of the corresponding electrode surface ES of the first electrode expansion portion 210E. Thus, in the display device 10, light may be emitted from the light emitting elements 300 evenly in any direction of the light emitting area LA, and thus visibility according to the direction of the display device 10 may be improved.

Meanwhile, although not shown in FIG. 2, a plurality of insulating layers are located in each sub pixel PXn. The insulating layers may include a first insulating layer 510, a second insulating layer 520, and a passivation layer 550. In other embodiments, the first insulating layer includes areas corresponding to the first electrode branch 210B and the second electrode branch 220B to entirely cover the sub-pixel PXn. The first insulating layer 510 may protect the electrodes 210 and 220, and may insulate the electrodes 210 and 220 from each other such that the electrodes 210 and 220 are not in direct contact with each other.

The second insulating layer 520 is located on the first insulating layer 510, and at least a portion of the second insulating layer 520 is located to partially overlap each of the electrode branches 210B and 220B.

The display device 10 may include a circuit element layer located under the electrodes 210 and 220 shown in FIG. 2. Hereinafter, a structure of the display device 10 will be described in detail with reference to FIG. 4.

Figure 4:
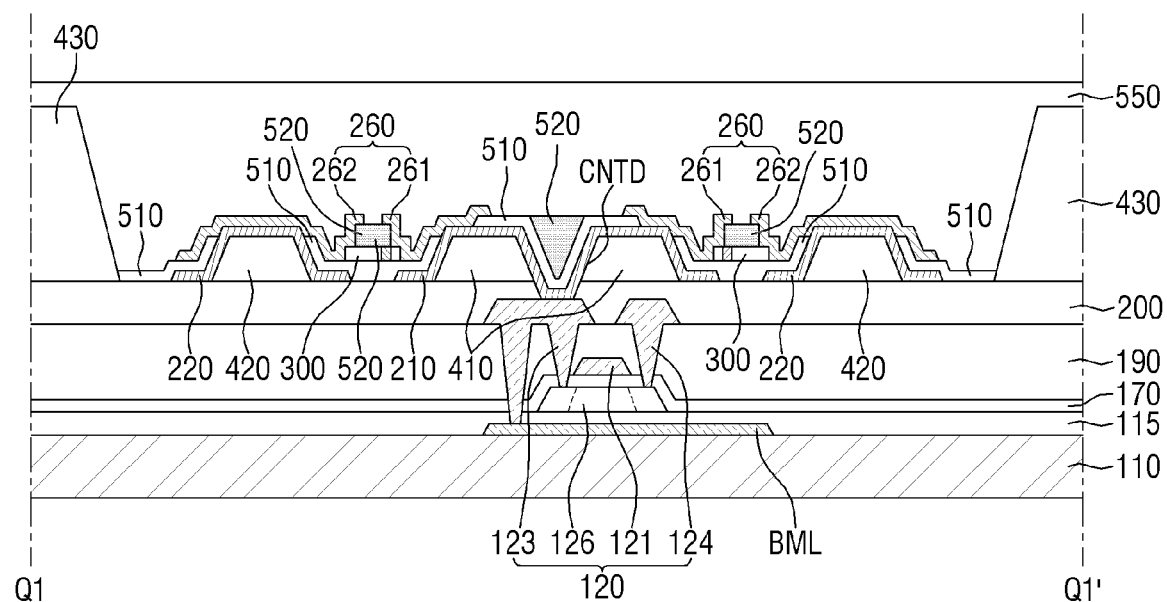
FIG. 4 is a cross-sectional view taken along the line Q1-Q1' of FIG. 2.

FIG. 4 is a cross-sectional view taken along the line Q1-Q1' of FIG. 2

FIG. 4 shows a cross-sectional view of the first sub-pixel PX1, but may be similarly applied to other pixels PX or sub-pixels PXn. FIG. 4 shows a cross-section across one end and the other end of any light emitting element 300.

Referring to FIGS. 2 and 4, the display device 10 may include a substrate 110, a buffer layer 115, a light blocking layer BML, a first transistor 120, and a plurality of electrodes 210 and 220 located on the first transistor 120, and a light emitting element 300. The first transistor 120 may include a first active material layer 126, a first gate electrode 121, a first drain electrode 123, and a first source electrode 124. The first transistor 120 may be a driving transistor that transmits an electrical signal to the first electrode 210 of the display device 10. However, the present disclosure is not limited thereto, and the display device 10 may include a larger number of transistors.

The substrate 110 may be an insulating substrate. The substrate 110 may be made of an insulating material such as glass, quartz, or polymer resin. The substrate 110 may be a rigid substrate, but may also be a flexible substrate capable of bending, folding, rolling, and the like.

The light blocking layer BML may be located on the substrate 110. The light blocking layer BML may be electrically connected to the first drain electrode 123 of the first transistor 120 to be described later.

The light blocking layer BML is located to overlap the first active material layer 126 of the first transistor 120. The light blocking layer BML may include a material that blocks light, thereby reducing or preventing light from being incident on the first active material layer 126. For example, the light blocking layer BML may be formed of an opaque metal material that blocks the transmission of light. Unlike FIG. 4, the display device 10 may include a larger number of light blocking layers BML. Although it is shown in the drawings that one first transistor 122 is located, the display device 10 may include a larger number of transistors. Thus, the display device 10 may further include a light blocking layer BML overlapping the active material layer of another transistor.

The buffer layer 115 is located on the light blocking layer BML and the substrate 110. The buffer layer 115 may be located to entirely cover both the substrate 110 and the light blocking layer BML. The buffer layer 115 may reduce or prevent the diffusion of impurity ions, may reduce or prevent the penetration of moisture or external air, and may perform a surface planarization function. The buffer layer 115 may insulate the light blocking layer BML and the first active material layer 126 from each other.

A semiconductor layer is located on the buffer layer 115. The semiconductor layer may include the first active material layer 126 of the first transistor 120. However, the present disclosure is not limited thereto, and the semiconductor layer may further include an active material layer of another transistor of the display device 10. The semiconductor layer may include polycrystalline silicon, monocrystalline silicon, or oxide semiconductor.

The first gate insulating layer 170 is located on the semiconductor layer. The first gate insulating layer 170 may be located to entirely cover both the buffer layer 115 and the semiconductor layer. The first gate insulating layer 170 may function as a gate insulating film of the first transistor 120.

A first conductive layer is located on the first gate insulating layer 170. The first conductive layer may include a first gate electrode 121 located on the first active material layer 126 of the first transistor 120 on the first gate insulating layer 170.

An interlayer insulating layer 190 is located on the first conductive layer. The interlayer insulating layer 190 may function as an interlayer insulating film. The interlayer insulating layer 190 may include an organic insulating material and may perform a surface planarization function.

A second conductive layer is located on the interlayer insulating layer 190. The second conductive layer includes the first drain electrode 123 and first source electrode 124 of the first transistor 120.

The first drain electrode 123 and the first source electrode 124 may be electrically connected to the first active material layer 126 through a respective contact hole penetrating the interlayer insulating layer 190 and the first gate insulating layer 170. The first drain electrode 123 may be electrically connected to the light blocking layer BML through another contact hole.

A via layer 200 is located on the second conductive layer. The via layer 200 may include an organic insulating material, and may perform a surface planarization function.

A plurality of partition walls 400 and a plurality of electrodes 210 and 220 are located on the via layer 200. Some of the partition walls 400 may be located at a boundary of each sub-pixel PXn and spaced apart from each other.

The partition walls 400 may be spaced apart from each other in each sub-pixel PXn. The partition walls 400 may include a first partition wall 410 and a second partition wall 420, which are located adjacent to the center of the sub-pixel PXn, and a third partition wall 430 that is located in some regions of the sub-pixel PXn and at a boundary thereof.

The third partition wall 430 may be a partition that defines a boundary of each sub-pixel PXn. The third partition wall 430 may be located to extend in the first direction DR1 and in the second direction DR2 at the boundary of each sub-pixel PXn to form one grid pattern. The third partition wall 430 may be formed to define each sub-pixel PXn and to reduce or prevent the color mixing of light emitted from each sub-pixel PXn.

The third partition wall 430 may also be located in the non-light emitting area NLA, which is other than the light emitting area LA of each sub-pixel PXn. That is, the third partition wall 430 may define the boundary of each sub-pixel PXn, and may define the light emitting area LA and the non-light emitting area NLA in each sub-pixel PXn. As will be described later, when manufacturing the display device 10, the light emitting element 300 may be aligned on an electrode by spraying an organic material or a solvent using inkjet printing. The third partition wall 430 may surround the first electrode expansion portion 210E and second electrode bending portion 220D located in each sub pixel PXn, and may function to reduce or prevent the organic material or the solvent from invading the boundary of the light emitting area LA. Thus, the light emitting element 300 may be aligned between the first electrode expansion portion 210E and the second electrode bending portion 220D, and may form the light emitting area LA.

Meanwhile, in some embodiments, when the display device 10 further includes another member, the member may be located on the third partition wall 430 such that the third partition wall 430 may function to support the member.

The first partition wall 410 and the second partition wall 420 are spaced apart from each other on the via layer 200 to face each other. The first partition wall 410 and the second partition wall 420 may serve as reflective partition walls for reflecting light emitted from the light emitting element 300 toward the upper portion of the display device 10. Each sub-pixel PXn may include a different number of first and second partition walls 410 and 420. As shown in the drawing, the first partition wall 410 may face the second partition walls 420 located to be respectively spaced apart from opposing sides of the first partition wall 410. As described above, because one first electrode expansion portion 210E and two second electrode bending portions 220D are located in the light emitting area LA of each sub-pixel PXn, one first partition wall 410 and two second partition walls 420 may be located in an area corresponding thereto. However, the present disclosure is not limited thereto, and a larger number of the first partition walls 410 and a larger number of the second partition walls 420 may be provided depending on the number of the electrodes 210 and 220 located in each sub-pixel PXn.

A portion of the first electrode 210, for example, a portion of the first electrode expansion portion 210E and a portion of the first electrode extension portion 210C, may be located on the first partition wall 410. A portion of the second electrode 220, for example, a portion of the second electrode bending portion 220D and a portion of the second electrode extension portion 220C, may be located on the second partition wall 420. It is understood that the first electrode 210 and the second electrode 220 located on the first partition wall 410 and the second partition wall 420 of FIG. 4 are the first electrode expansion portion 210E and the second electrode bending portion 220D, respectively.

An electrode contact hole CNTD, which penetrates the first partition wall 410 and the via layer 200 to expose a portion of the upper surface of the first drain electrode 123 of the first transistor 120, may be formed in the first partition wall 410. The electrode contact hole CNTD may be formed in an area overlapping the first electrode expansion portion 210E of the first partition wall 410, and some regions of the first partition wall 410 may be separated from each other by the electrode contact hole CNTD. The first electrode expansion portion 210E may be electrically connected to the first transistor 120 of the circuit element layer through the electrode contact hole CNTD formed in the first partition wall 410.

The first partition wall 410, the second partition wall 420, and the third partition wall 430 may be formed in substantially the same process. The first partition wall 410, the second partition wall 420, and the third partition wall 430 may have a structure in which at least a part thereof protrudes upward from the via layer 200. The first partition wall 410, the second partition wall 420, and the third partition wall 430 may protrude upward based on the plane where the light emitting element 300 is located, and at least a portion of the protruding portions may have an inclination. The shapes of the first partition wall 410, the second partition wall 420, and the third partition wall 430, which have the protruding portions or protruding structure, are not particularly limited. These partition walls need not be formed to have the same step. In an embodiment, the third partition wall 430 may be formed to have a height that is greater than that of the first partition wall 410 and/or the second partition wall 420. In some embodiments, the first partition wall 410 and the second partition wall 420 may be omitted. The plurality of partition walls 400 may include polyimide (PI).

The electrodes 210 and 220 are located on the first partition wall 410 and the second partition wall 420. In some embodiments, some regions of the electrodes 210 and 220, for example, parts of the first electrode stem 210S and the second electrode stem 220S and parts of the first electrode extension portion 210C and the second electrode extension portion 220C, may be located on the third partition wall 430.

The first electrode 210 is located to cover the first partition wall 410, and the second electrode 220 is located to cover the second partition wall 420. The first electrode 210 on the first partition wall 410 may be the first electrode expansion portion 210E, and may be electrically connected to the first transistor 120 through the electrode contact hole CNTD. The second electrode 220 on the second partition wall 420 may be the second electrode bending portion 220D.

Each of the electrodes 210 and 220 may be formed as one layer as shown in the drawing. In an embodiment, the electrodes 210 and 220 may include a conductive material having high reflectance. The electrodes 210 and 220 may transmit the electrical signals transmitted from the circuit element layer to the light emitting element 300, and may concurrently reflect the light emitted from the light emitting element 300 through the first partition wall 410 and the second partition wall 420. In an embodiment, each of the electrodes 210 and 220 may be made of an alloy containing aluminum (Al), nickel (Ni), or lanthanum (La). However, the present disclosure is not limited thereto, and each of the electrodes 210 and 220 may be formed as a plurality of layers, and may include a material such as silver (Ag), copper (Cu), indium tin oxide (ITO), indium zinc oxide (IZO), or indium tin-zinc oxide (ITZO). For example, each of the electrodes 210 and 220 may be formed to have a laminate structure of Ag/ITO/IZO.

The first insulating layer 510 is located to partially cover the first electrode 210 and the second electrode 220. The first insulating layer 510 may be located to cover most of the upper surfaces of the first electrode 210 and the second electrode 220, and may also expose a portion of the first electrode 210 and a portion of the second electrode 220. The first insulating layer 510 may be located in an area where the first electrode 210 and the second electrode 220 are spaced apart from each other, and in an area between the first electrode 210 and the third partition wall 430, and also in an area between the second electrode 220 and the third partition wall 430. The first insulating layer 510 located between the first electrode 210 and the second electrode 220 may extend in the second direction DR2 on a plane to have a linear or island shape. A portion of the first insulating layer 510 located on the first electrode 210 may also be located in the electrode contact hole CNTD.

The first insulating layer 510 is located to partially expose the relative flat upper surfaces of the first electrode 210 and the second electrode 220, and is located to overlap the inclined side surfaces of the first partition wall 410 and the second partition wall 420. The first insulating layer 510 forms a flat upper surface such that the light emitting element 300 may be located thereon, and the flat upper surface extends toward the first electrode 210 and the second electrode 220 in one direction. An extending portion of the first insulating layer 510 terminates at the inclined side surfaces of the first electrode 210 and the second electrode 220. Accordingly, the contact electrode 260 may be in contact with the exposed first electrode 210 and second electrode 220, and may be smoothly in contact with the light emitting element 300 on the flat upper surface of the first insulating layer 510.

The first insulating layer 510 may protect the first electrode 210 and the second electrode 220 and may insulate them from each other. Further, the first insulating layer 510 may reduce or prevent damage to the light emitting element 300 located on the first insulating layer 510 otherwise caused by contact with other members. However, the shape and structure of the first insulating layer 510 are not limited thereto.

In some cases, the light emitting element 300 may be located on the first insulating layer 510. At least one light emitting element 300 may be located on the first insulating layer 510 located between the respective electrode branches 210B and 220B. Both ends of the light emitting element 300 may form a surface substantially parallel to both ends of the underlying first insulating layer 510. The light emitting element 300 may be located such that a part thereof overlaps the electrodes 210 and 220. The light emitting element 300 may be located on each end where the first electrode expansion portion 210E and the second electrode bending portion 220D face each other, and may be electrically connected to each of the electrodes 210 and 220 through the contact electrode 260.

Meanwhile, the light emitting element 300 may be configured such that a plurality of layers are located in a direction horizontal to the via layer 200. The light emitting element 300 of the display device 10 according to an embodiment may include the aforementioned conductive semiconductor and active layer, and these conductive semiconductor and active layer may be sequentially located in a direction horizontal to the via layer 200. The light emitting element 300 may be configured such that the first conductive semiconductor 310, the active layer 330, the second conductive semiconductor 320, and the conductive electrode layer 370 may be sequentially located in a direction horizontal to the via layer 200 (e.g., see FIG. 5). However, the present disclosure is not limited thereto. The order in which the plurality of layers of the light emitting element 300 are arranged may be reversed, and in some case, the plurality of layers may instead be arranged in a direction perpendicular to the via layer 200 when the light emitting element 300 has a different structure.

The second insulating layer 520 may be partially located on the first insulating layer 510 and the light emitting element 300. The second insulating layer 520 may function to protect the light emitting element 300 and to fix, or secure, the light emitting element 300 in the process of manufacturing the display device 10. The second insulating layer 520 may be located to surround or partially surround the outer surface of the light emitting element 300. That is, in some embodiments, some of the materials of the second insulating layer 520 may be located between the lower surface of the light emitting element 300 and the first insulating layer 510. The second insulating layer 520 may extend in the second direction DR2 between the first electrode branch 210B and the second electrode branch 220B in a plan view, and may have an island or linear shape.

Further, a portion of the second insulating layer 520 may be located in the electrode contact hole CNTD of the first partition wall 410, and may also be located on the first insulating layer 510. In an embodiment, the second insulating layer 520 may include an organic insulating layer, and may reduce or minimize the step that is formed by the electrode contact hole CNTD of the first partition wall 410. As shown in the drawings, the second insulating layer 520 located in the electrode contact hole CNTD may planarize the upper surfaces of the first electrode 210 and the first insulating layer 510 on the first partition wall 410.

The contact electrode 260 is located on each of the electrodes 210 and 220, the first insulating layer 510, and the second insulating layer 520. The first contact electrode 261 and the second contact electrode 262 are spaced apart from each other on the second insulating layer 520 covering the light emitting element 300. Accordingly, the second insulating layer 520 may insulate the first contact electrode 261 and the second contact electrode 262 from each other.

The first contact electrode 261 may be in contact with at least the first insulating layer 510, the first electrode 210 that is exposed by patterning the first insulating layer 510, and one end of the light emitting element 300. The second contact electrode 262 may be in contact with at least the second electrode 220 that is exposed by patterning the first insulating layer 510, and with the other end of the light emitting element 300. The first contact electrode 261 and the second contact electrode 262 may be in contact with respective end side surfaces of the light emitting element 300, for example, with the first conductive semiconductor 310, the second conductive semiconductor 320, or the conductive electrode layer 370. As described above, the first insulating layer 510 may form a flat upper surface, so that the contact electrode 260 may be smoothly in contact with the side surface of the light emitting element 300 located on the flat upper surface of the first insulating layer 510.

The contact electrode 260 may include a conductive material. For example, the contact electrode 260 may include ITO, IZO, ITZO, or aluminum (Al). However, the material of the contact electrode 260 is not limited thereto.

The passivation layer 550 is located on the partition wall 400, the first insulating layer 510, the second insulating layer 520, and the contact electrode 260. The passivation layer 550 may function to protect members located on the via layer 200 from external environments.

Each of the first insulating layer 510, the second insulating layer 520, and the passivation layer 550 may include an inorganic insulating material or an organic insulating material. In an embodiment, each of the first insulating layer 510, the second insulating layer 520, and the passivation layer 550 may include an inorganic insulating material such as silicon oxide (SiOx), silicon nitride (SiNx), silicon oxynitride (SiOxNy), aluminum oxide ($Al_2O_3$), or aluminum nitride (AlN). Further, each of the first insulating layer 510, the second insulating layer 520, and the passivation layer 550 may include an organic insulating material, such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the material thereof is not limited thereto.

Figure 5:
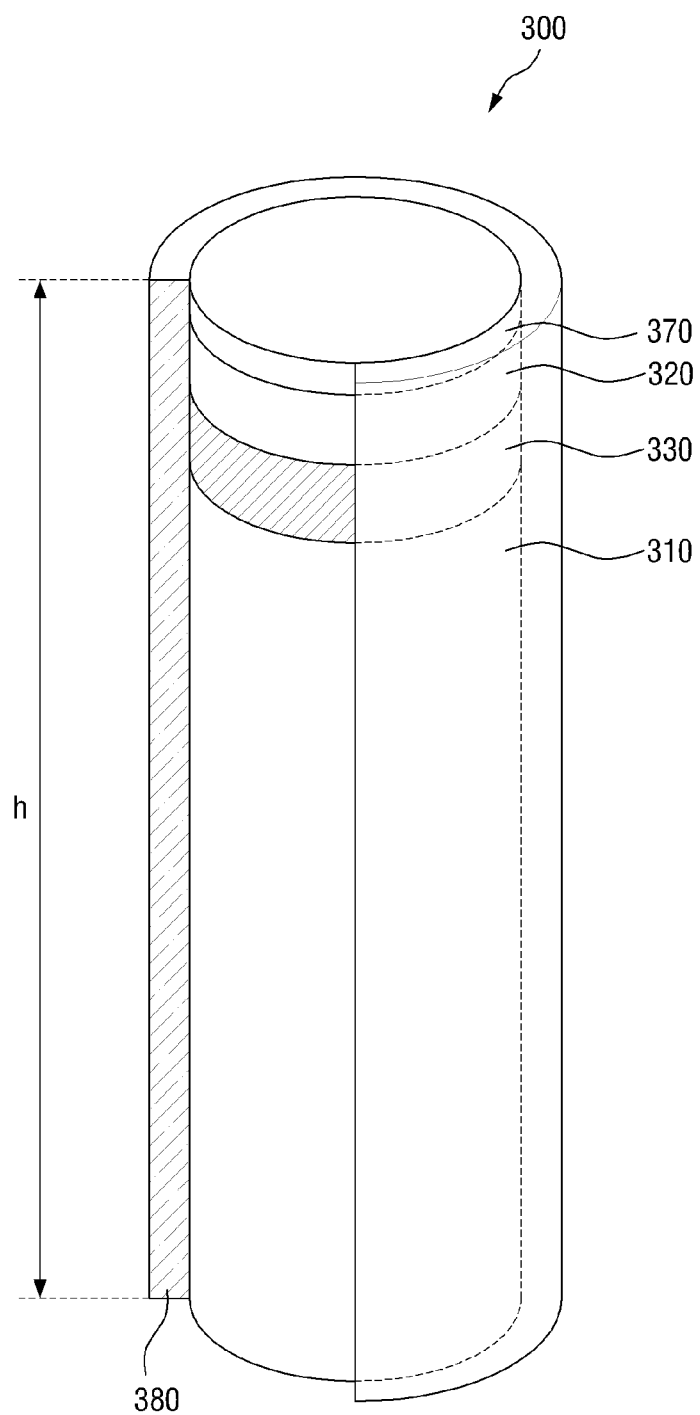
FIG. 5 is a schematic view of a light emitting element according to an embodiment.

FIG. 5 is a schematic view of a light emitting element according to an embodiment.

The light emitting element 300 may be a light emitting diode. For example, the light emitting element 300 may be an inorganic light emitting diode having a size of about a micrometer or about a nanometer, and may be made of an inorganic material. When an electric field is formed between two electrodes facing each other (e.g., facing each other in a predetermined direction), the organic light emitting diode may be aligned between the two electrodes having polarity. The light emitting element 300 may be aligned between the two electrodes according to the electric field formed on the two electrodes.

The light emitting element 300 may have a shape extending in one direction. The light emitting element 300 may have a shape of a nanorod, a nanowire, a nanotube, or the like. In an embodiment, the light emitting element 300 may have a cylindrical shape or a rod shape. However, the shape of the light emitting element 300 is not limited thereto, and the light emitting element 300 may have various shapes such as a cube, a cuboid, and a hexagonal column. A plurality of semiconductors included in the light emitting element 300 to be described later may be sequentially arranged or stacked in one direction.

The light emitting element 300 may include semiconductor crystals doped with any conductive type (for example, p-type or n-type) impurity. The semiconductor crystals may receive an electrical signal applied from an external power source, and may emit the electrical signal as light of a given wavelength band.

The light emitting element 300 according to an embodiment may emit light of a given wavelength band. In an embodiment, the light emitted from an active layer 330 may emit blue light having a central wavelength band of about 450 nm to about 495 nm. However, the central wavelength band of the blue light is not limited to the above range, and should be understood to include all wavelength ranges that can be recognized as blue in the art. Further, the light emitted from the active layer 330 of the light emitting element 300 is not limited thereto, and also may be green light having a central wavelength band of about 495 nm to about 570 nm, or may be red light having a central wavelength band of about 620 nm to about 750 nm.

Meanwhile, the light emitting element 300 according to an embodiment may include a first conductive semiconductor 310, a second conductive semiconductor 320, an active layer 330, and an insulating film 380. The light emitting element 300 according to an embodiment may further include at least one conductive electrode layer 370. Although it is shown in FIG. 5 that the light emitting element 300 further includes one conductive electrode layer 370, the present disclosure is not limited thereto. In some cases, the light emitting element 300 may include a larger number of conductive electrode layers 370, or the conductive electrode layer 370 may be omitted. Description of the light emitting element 300 to be described later may be equally applied even if the number of the conductive electrode layers 370 is different, or even if the light emitting element 300 further includes other structures.

Referring to FIG. 5, the first conductive semiconductor 310 may be, for example, an n-type semiconductor having a first conductive type. For example, when the light emitting element 300 emits light of a blue wavelength band, the first conductive semiconductor 310 may include a semiconductor material having a chemical formula of $Al_xGa_yIn_{1-x-y}N$ ($0 \leq x \leq 1, 0 \leq y \leq 1, 0 \leq x+y \leq 1$). For example, the semiconductor material may be at least one of AlGaInN, GaN, AlGaN, InGaN, AlN, and InN, each being doped with n-type impurities. The first conductive semiconductor 310 may be doped with a first conductive dopant. The first conductive dopant may be, for example, Si, Ge, or Sn. In an embodiment, the first conductive semiconductor 310 may be n-GaN doped with n-type Si. The length of the first conductive semiconductor 310 may have a range of about 1.5 μm to about 5 μm, but is not limited thereto.

The second conductive semiconductor 320 is located on the active layer 330 to be described later. The second conductive semiconductor 320 may be, for example, a p-type semiconductor having a second conductive type. For example, when the light emitting element 300 emits light of a blue wavelength band or a green wavelength band, the second conductive semiconductor 320 may include a semiconductor material having a chemical formula of $Al_xGa_yIn_{1-x-y}N$ ($0 \leq x \leq 1, 0 \leq y \leq 1, 0 \leq x+y \leq 1$). For example, the semiconductor material may be at least one of AlGaInN, GaN, AlGaN, InGaN, AlN, and InN, each being doped with p-type impurities. The second conductive semiconductor 320 may be doped with a second conductive dopant. The second conductive dopant may be, for example, Mg, Zn, Ca, Se, or Ba. In an embodiment, the second conductive semiconductor 320 may be p-GaN doped with p-type Mg. The length of the second conductive semiconductor 320 may have a range of about 0.08 μm to about 0.25 μm, but is not limited thereto.

Meanwhile, although it is shown in FIG. 5 that each of the first conductive semiconductor 310 and the second conductive semiconductor 320 is formed as one layer, the present disclosure is not limited thereto. In some cases, each of the first conductive semiconductor 310 and the second conductive semiconductor 320 may further include a larger number of layers, for example, clad layers or tensile strain barrier reducing (TSBR) layers.

The active layer 330 is located between the first conductive semiconductor 310 and the second conductive semiconductor 320. The active layer 330 may include a material of a single or multiple quantum well structure. When the active layer 330 includes a material of a multiple quantum well structure, the active layer 330 may have a structure in which quantum layers and well layers are alternately laminated. The active layer 330 may emit light by the combination of electron-hole pairs according to an electrical signal(s) applied through the first conductive semiconductor 310 and the second conductive semiconductor 320. For example, when the active layer 330 emits light of a blue wavelength band, the active layer 330 may include a material such as AlGaN or AlGaInN. For example, when the active layer 330 has a multiple quantum well structure in which quantum layers and well layers are alternately laminated, the quantum wells may include a material such as AlGaN or AlGaInN, and the well layers may include a material such as GaN or AlInN. In an embodiment, the active layer 330 includes quantum wells each containing AlGaInN and well layers each containing AlInN, and thus the active layer 330 may emit blue light having a central wavelength band of about 450 nm to about 495 nm as described above.

However, the present disclosure is not limited thereto, and the active layer 330 may have a structure in which semiconductor materials having high bandgap energy, and semiconductor materials having low bandgap energy, are alternately laminated, and may include other group 3 to group 5 semiconductor materials depending on the wavelength band of light. The light emitted from the active layer 330 is not limited to light of a blue wavelength band, and in some cases, the active layer 330 may emit light of a red or green wavelength band. The length of the active layer 330 may have a range of about 0.05 µm to about 0.25 µm, but is not limited thereto.

Meanwhile, the light emitted from the active layer 330 may be emitted to both side surfaces of the light emitting element 300, as well as to the longitudinal outer surface of the light emitting element 300. The direction of the light emitted from the active layer 330 is not limited to one direction.

The conductive electrode layer 370 may be an ohmic contact electrode. However, the present disclosure is not limited thereto, and the conductive electrode layer 370 may be a Schottky contact electrode. For example, the conductive electrode layer 370 may include at least one of aluminum (Al), titanium (Ti), indium (In), gold (Au), silver (Ag), indium tin oxide (ITO), indium zinc oxide (IZO), and indium tin-zinc oxide (ITZO). The conductive electrode layer 370 may include a semiconductor material doped with n-type or p-type impurities. The conductive electrode layer 370 may include the same material, and may include different materials from each other, but the present disclosure is not limited thereto.

The insulating film 380 is located to surround the outer surfaces of the plurality of semiconductors described above. In an embodiment, the insulating film 380 may be located to surround at least the outer surface of the active layer 330, and may extend in one direction in which the light emitting element 300 extends. The insulating film 380 may function to protect the members described above. For example, the insulating film 380 may be formed to surround the side surfaces of the members (e.g., the first conductive semiconductor 310, the active layer 330, the second conductive semiconductor 320, and/or the conductive electrode layer 370), and may be formed such that both ends of the light emitting element 300 in a length direction are exposed therethrough.

Although it is shown in FIG. 5 that the insulating film 380 may extend in the length direction of the light emitting element 300 to cover the first conductive semiconductor 310 to the conductive electrode layer 370, the present disclosure is not limited thereto. The insulating film 380 may cover only the outer surface of a portion of the conductive semiconductor as well as the active layer 330, or may cover only a portion of the outer surface of the conductive electrode layer 370 to expose a portion of the outer surface of the conductive electrode layer 370.

The thickness of the insulating film 380 may have a range of about 10 nm to about 1.0 µm, but is not limited thereto. For example, the thickness of the insulating film 380 may be 40 nm.

The insulating film 380 may include a material having insulating properties, for example, silicon oxide (SiOx), silicon nitride (SiNx), silicon oxynitride (SiOxNy), aluminum nitride (AlN), or aluminum oxide ($Al_2O_3$). Thus, the active layer 330 may reduce or prevent an electrical short that may otherwise occur when the active layer 330 is in direct contact with an electrode through which an electrical signal is transmitted to the light emitting element 300. Further, because the insulating film 380 protects the outer surface of the light emitting element 300 as well as the active layer 330, it is possible to reduce or prevent the deterioration in light emission efficiency.

In some embodiments, the outer surface of the insulating film 380 may be surface-treated. When manufacturing the display device 10, the light emitting elements 300 may be aligned by being sprayed onto the electrodes in a state in which they are dispersed in an ink (e.g., a predetermined ink). Here, the surface of the insulating film 380 may be hydrophobically or hydrophilically treated to maintain the light emitting elements 300 in a dispersed state without being aggregated with other adjacent light emitting elements 300 in the ink.

Meanwhile, the length h of the light emitting element 300 may have a range of about 1 µm to about 10 µm, or of about 2 µm to about 6 µm, or even of about 4 µm to about 5 µm. The diameter of the light emitting element 300 may have a range of about 300 nm to about 700 nm, and the aspect ratio of the light emitting element 300 may have a range of about 1.2 to about 100. However, the present disclosure is not limited thereto, and the plurality of light emitting elements 300 included in the display device 10 may have different diameters according to the composition difference of the active layer 330. For example, the diameter of the light emitting element 300 may have a range of about 500 nm.

FIGS. 6 to 15 are schematic view showing a process of manufacturing a display device according to an embodiment.

Figure 6:
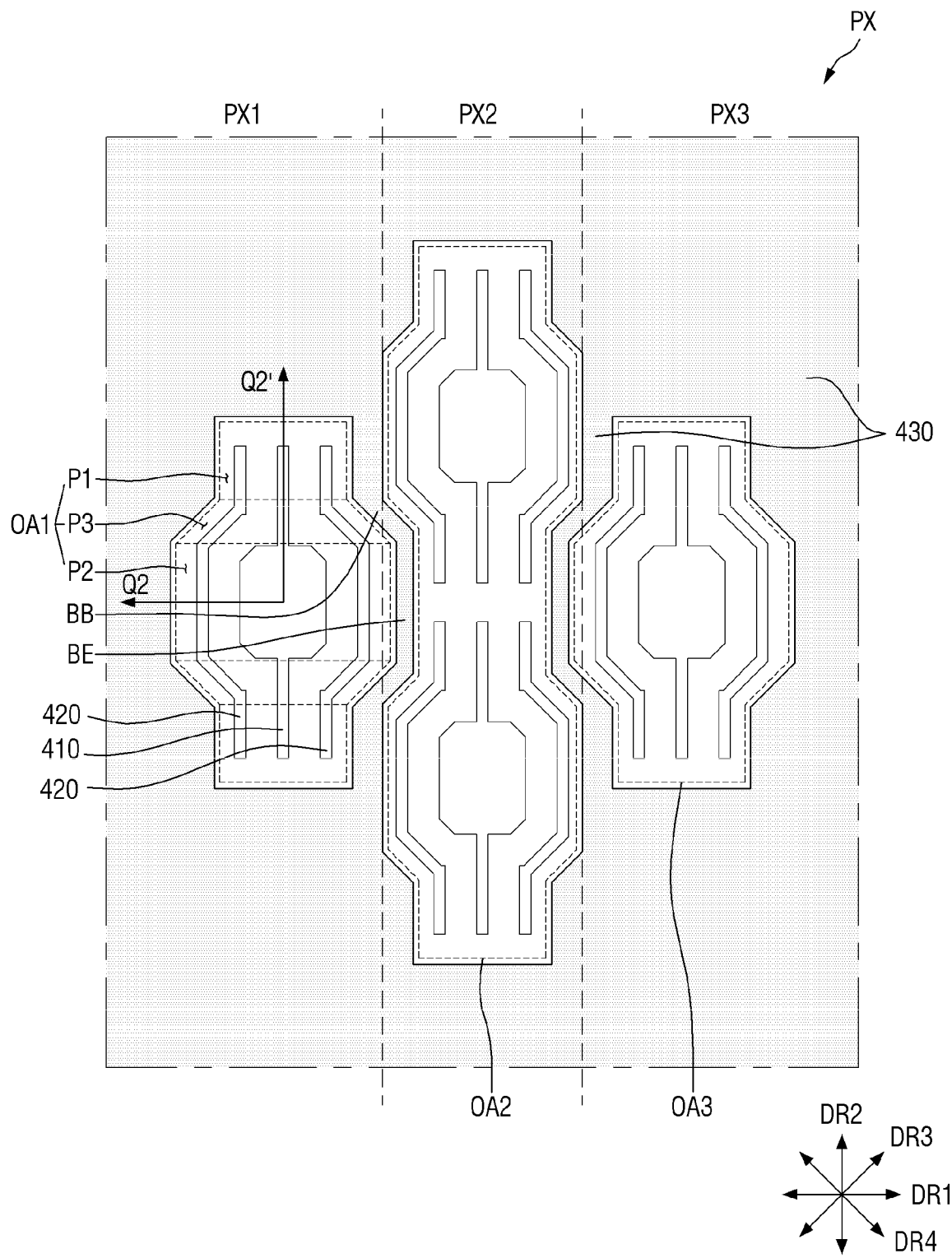
FIGS. 6 to 15 are schematic view showing a process of manufacturing a display device according to an embodiment.
Figure 7:
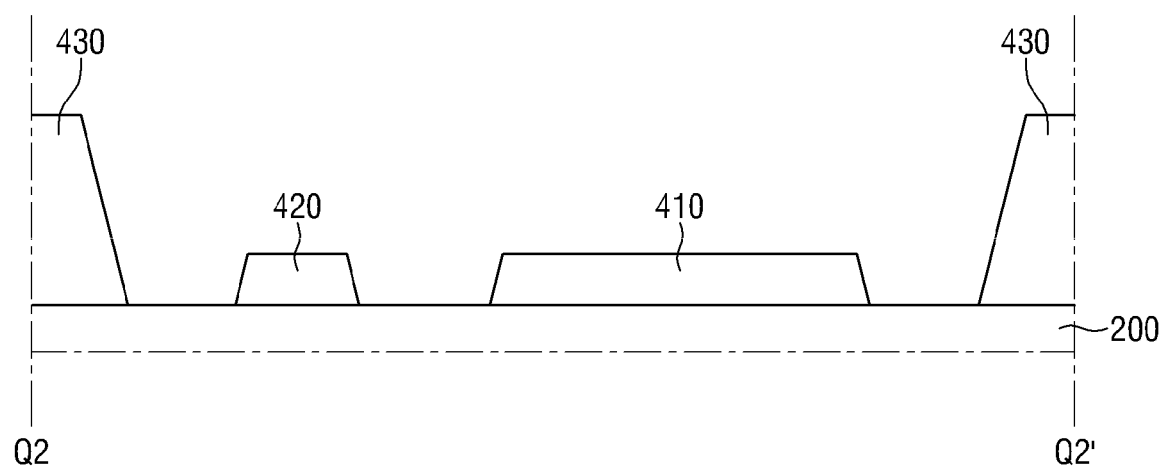

First, referring to FIGS. 6 and 7, a plurality of partition walls 400 are formed on the via layer 200. FIG. 7 is a cross-sectional view taken along the line Q2-Q2' of FIG. 6. The plurality of partition walls 400 may include a first partition wall 410, a second partition wall 420, and a third partition wall 430, and the third partition wall 430 may be located to surround the light emitting area LA of each sub-pixel PXn. That is, the third partition wall 430 may be substantially located in the non-light emitting area NLA. The third partition wall 430 may also be located at the boundary of each sub-pixel PXn.

The first partition wall 410 and the second partition wall 420 are formed to overlap some regions of the first electrode expansion portion 210E and the second electrode bending portion 220D, and to overlap some regions of the first electrode extension portion 210C and the second electrode extension portion 220C in the light emitting area LA of each sub-pixel PXn, respectively. As described above, the first partition wall 410 and the second partition wall 420 are formed to have the same shape as some respective regions of the first electrode expansion portion 210E and the second electrode bending portion 220D and some respective regions of the first electrode extension portion 210C and the second electrode extension portion 220C. For example, because the second sub-pixel PX2 includes two light emitting areas LA, the second sub-pixel PX2 may be provided with a larger number of the first partition walls 410 and the second partition walls 420 as compared with each of the first sub-pixel PX1 and the third sub-pixel PX3. The first partition wall 410 and second partition wall 420 of the second sub-pixel PX2 may be spaced apart from each other between the light emitting areas LA. Because detailed description of such a structure is the same as that described above, it will be omitted.

Meanwhile, as described above, the third partition wall 430 may be entirely disposed on the plurality of sub-pixels PXn, and may include opening areas OA1, OA2, and OA3 exposing the light emitting areas LA of the sub-pixels PXn. For example, the third partition wall 430 may include a first opening area OA1 exposing the light emitting area LA of the first sub-pixel PX1, a second opening area OA2 exposing the light emitting area LA of the second sub-pixel PX2, and a third opening area OA3 exposing the light emitting area LA of the third sub-pixel PX3. Each of the opening areas OA1, OA2, and OA3 is a portion in which the light emitting elements 300 are disposed in the sub-pixel PXn, and may be disposed corresponding to the first electrode extension portion 210E. Further, as described above, the third partition wall 430 may be formed to have a greater height than each of the first partition wall 410 and the second partition wall 420.

Although it is shown in the drawings that only the first sub-pixel PX1, the second sub-pixel PX2, and the third sub-pixel PX3 are provided, in other embodiments other sub-pixels PXn may be provided. Hereinafter, the first sub-pixel PX1, the second sub-pixel PX2, and the third sub-pixel PX3 will be described as an example.

Figure 8:
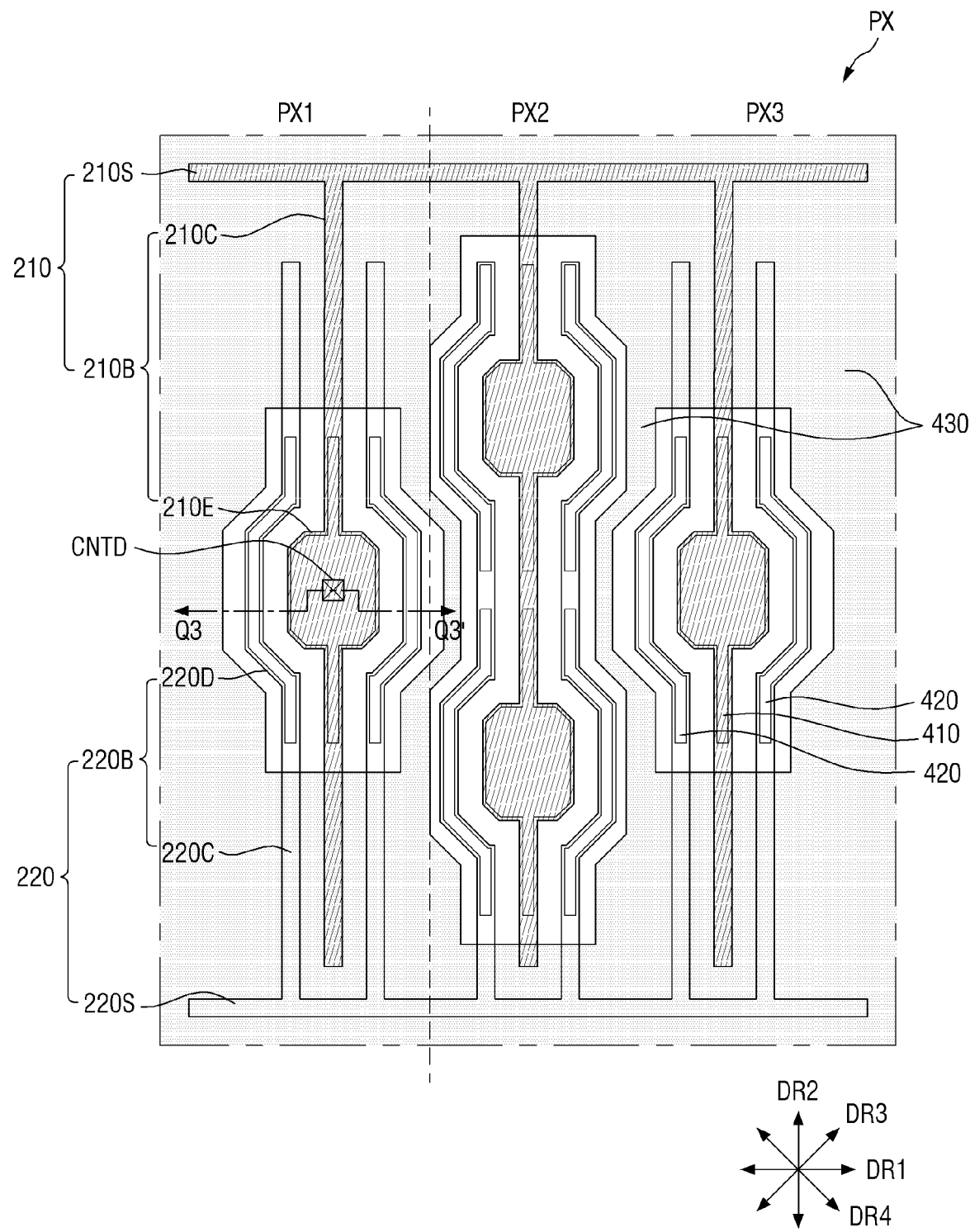
Figure 9:
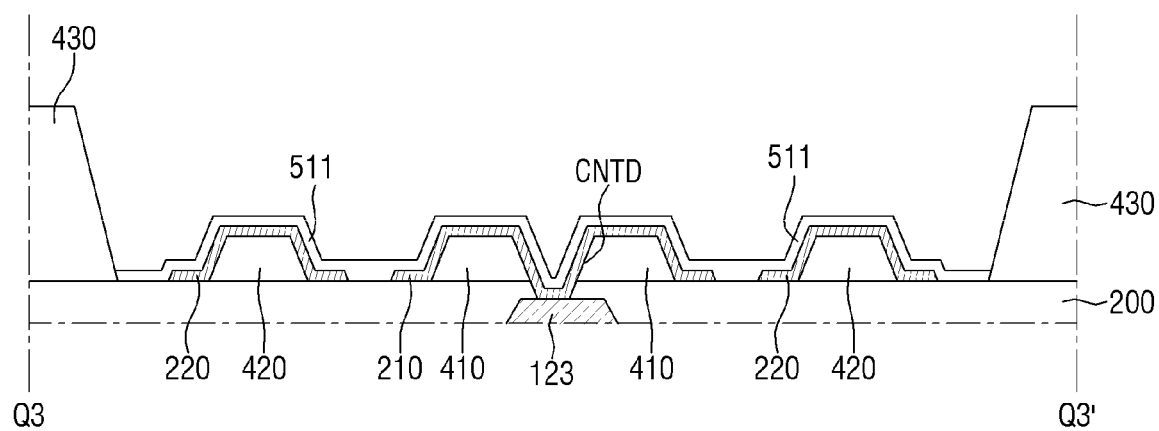

Next, referring to FIGS. 8 and 9, a first electrode 210 and a second electrode 220 are formed on the plurality of partition walls 400. The first electrode 210 includes a first electrode stem 210S and a first electrode branch 210b, and for example, the first electrode branch 210B includes a first electrode expansion portion 210E and a first electrode extension portion 210C. The first electrode expansion portion 210E and a portion of the first electrode extension portion 210C may be located on the first partition wall 410, and the first electrode stem 210S and another portion of the first electrode extension portion 210C may be located on the third partition wall 430.

The second electrode 220 includes a second electrode stem 220S and a second electrode branch 220B, and for example, the second electrode branch 220B includes a second electrode bending portion 220D and a second electrode extension portion 220C. The second electrode bending portion 220D and a portion of the second electrode extension portion 220C may be located on the second partition wall 420, and the second electrode stem 220S and another portion of the second electrode extension portion 220C may be located on the third partition wall 430.

Alternatively, in an embodiment in which the electrodes 210 and 220 are formed prior to the third partition wall 430, the other part of the second electrode extension portion 220C and the second electrode stem 220S may be disposed under the third partition wall 430.

In an embodiment, each of the opening areas OA1, OA2, and OA3 of the third partition wall 430 may have a structure corresponding to the shape of each of the electrodes 210 and 220 disposed in each sub-pixel PXn in a plan view. For example, the first opening area OA1 may comprise a first opening portion P1 in which the first electrode extension portion 210C is disposed, a second opening portion P2 in which the first electrode expansion portion 210E is disposed and a width of which in one direction is greater than a width of the first opening portion P1 in one direction, and a third opening portion P3 which connects the first opening portion P1 and the second opening portion P2 and a width of which becomes narrower. As described above, the first electrode 210 may comprise the first electrode expansion portion 210E and the first electrode extension portion 210C, and may have a shape in which a width is partially enlarged. The first electrode extension portions 210C are disposed at both sides of the first electrode extension portion 210E in the second direction DR2, and the width of the area where the electrodes 210 and 220 are disposed may be relatively narrow at the portion where the first electrode extension portions 210C are disposed. Each of the opening areas OA1, OA2, and OA3 of the third partition wall 430 may comprise portions whose width is changed according to the shape of the first electrode 210.

A part of the second electrode extension portion 220C and the second electrode bending portion 220D may be disposed corresponding to the shape of the first electrode extension portion 210E, and may be disposed in the opening areas OA1, OA2, and OA3 of the third partition wall 430. For example, in the second electrode extension portion 220C, a portion spaced apart from the first electrode expansion portion 210E and a portion extending to the first electrode extension portion 210C may be partially disposed in the opening areas OA1, OA2, and OA3, and the second electrode bending portion 220D may be disposed in the opening areas OA1, OA2, and OA3. At least a part of the second electrode extension portion 220C and at least a part of the second electrode bending portion 220D may be disposed between the first electrode 210 and the third partition wall 430 in a cross-sectional view.

As described above, the respective sub-pixels PXn may have different electrode structures or light emitting areas LA from each other. For example, the first sub-pixel PX1 may be provided with one first electrode expansion portion 210E to form one light emitting area LA, and the second sub-pixel PX2 may be provided with a plurality of first electrode expansion portion 210E or two first electrode expansion portion 210E to form two light emitting areas LA. Accordingly, the shape and arrangement of the opening areas OA1, OA2, and OA3 of the third partition wall 430 may also be changed.

In an embodiment, the third partition wall 430 may comprise a first opening area OA1 exposing the light emitting area LA of the first sub-pixel PX1, a second opening area OA2 exposing the light emitting area LA of the second sub-pixel PX2, and a third opening area OA3 exposing the light emitting area LA of the third sub-pixel PX3. The first opening area OA1 and the third opening area OA3 may comprise one second opening portion P2, and the second opening area OA2 may comprise a plurality of second opening portions P2 spaced apart from each other in the second direction DR2. The plurality of second opening portions P2 may be connected to the second opening area OA2 through the first opening portion P1. The opening areas OA1, OA2, and OA3 of the third partition wall 430 may have structures corresponding to the shape of the light emitting area LA in which the light emitting elements 300 are disposed, or the shapes of the electrodes 210 and 220, and the structures of the opening areas OA1, OA2, and OA3 disposed in the respective sub-pixels PXn may be different from each other.

Further, in the display device 10, sub-pixels each provided with one first electrode expansion portion 210E (for example, the first pixels and the third sub-pixels) and sub-pixels each provided with two first electrode expansion portions 210E (for example, the second sub-pixels) are alternately arranged, so that, in the opening areas OA1, OA2, and OA3 of the third partition wall 430, the first opening areas OA1 and the third opening areas OA3, and the second opening areas OA2 may also be alternately arranged along the first direction DR1.

Meanwhile, the third partition wall 430 may also be disposed between the neighboring sub-pixels PXn. A portion of the third partition wall 430, the portion being disposed between the sub-pixels PXn, may also have a structure corresponding to the shape of each of the electrodes 210 and 220. In an embodiment, the third partition wall 430 may be disposed between the neighboring sub-pixels PXn, and may comprise a partition wall extension portion BE extending in the second direction DR corresponding to the first surface of the first electrode expansion portion 210E and a partition wall bending portion BE extending in the third direction DR3 or the fourth direction DR4 corresponding to the second surface of the first electrode expansion portion 210E. As the partition wall extension portion BE and the partition wall bending portion BB have structures corresponding to the shapes of the electrodes 210 and 220, their positions may be changed depending on the width of each of the opening areas OA1, OA2, and OA3.

In an exemplary embodiment, the partition wall extension portion BE may be disposed corresponding to the second opening portion P2 of the opening areas OA1, OA2, and OA3, and the partition wall bending portion BB may be disposed corresponding to the third opening portion P3 thereof. The first opening portion P1, the second opening portion P2, and the third opening portion P3 of the third partition wall 430 may have different widths. Since the widths of the first opening portion P1 and the second opening portion P2 are constant, the partition wall extension portion BE may be disposed in the corresponding portion. Since the third opening portion P3 connects the first opening portion P1 and the second opening portion P2 and the width thereof becomes narrower, the partition wall bending portion BB may be disposed in the corresponding portion. For example, in the third partition wall 430 disposed between the first sub-pixel PX1 and the second sub-pixel PX2, the partition wall extension portion BE and the partition wall bending portion BB are disposed corresponding to the first electrode expansion portion 210E disposed in the first sub-pixel PX1, and they may be disposed between the second opening portion P2 of the first opening area OA1 and the first opening portion P1 connecting the second opening portion P2 of the second opening area OA2. The partition wall extension portion BE and the partition wall bending portion BB may be disposed to distinguish an area between the light emitting areas LA of the first and third sub-pixels PX1 and PX3 in which one first electrode expansion portion 210E is disposed and the light emitting areas LA of the second sub-pixel PX2 in which two first electrode expansion portion 210E are disposed. As shown in the drawing, the third partition wall 430 may disposed over the plurality of sub-pixels PXn and may comprise the opening areas OA1, OA2, and OA3 so as to expose the light emitting areas LA of each of the sub-pixels PXn, and the third partition wall 430 may distinguish the light emitting areas LA of each of the sub-pixels PXn.

In the process of manufacturing the display device 10, the first electrode 210 and the second electrode 220 may be initially integrally formed without the respective sub-pixels PXn or the electrode stems and branches being separated from each other, and then may be disconnected in subsequent processes. As shown in FIG. 8, the first electrode 210 and the second electrode 220 may form one electrode line without being separated from each other.

Next, a first insulating material layer 511 covering the first electrode 210 and the second electrode 220 is formed. The first insulating material layer 511 may be located on the via layer 200 to entirely cover the above members. The first insulating material layer 511 may be patterned in the subsequent process to be described later to form the first insulating layer of FIG. 3.

Next, light emitting elements 300 are arranged in the light emitting area of each sub-pixel PXn or on the first electrode expansion portion 210E and the second electrode bending portion 220D.

In the method of aligning the light emitting elements 300, a solution S (see FIG. 11) including the light emitting elements 300 may be sprayed on the electrodes 210 and 220, and an alignment power supply may be applied to each of the electrodes 210 and 220 to align the light emitting elements 300. The alignment power supply may form an electric field between the electrodes 210 and 220 to apply a dielectrophoretic force to the light emitting elements 300. The light emitting elements 300 may be aligned between the electrodes 210 and 220 in the solution S by the dielectrophoretic force.

Figure 10:
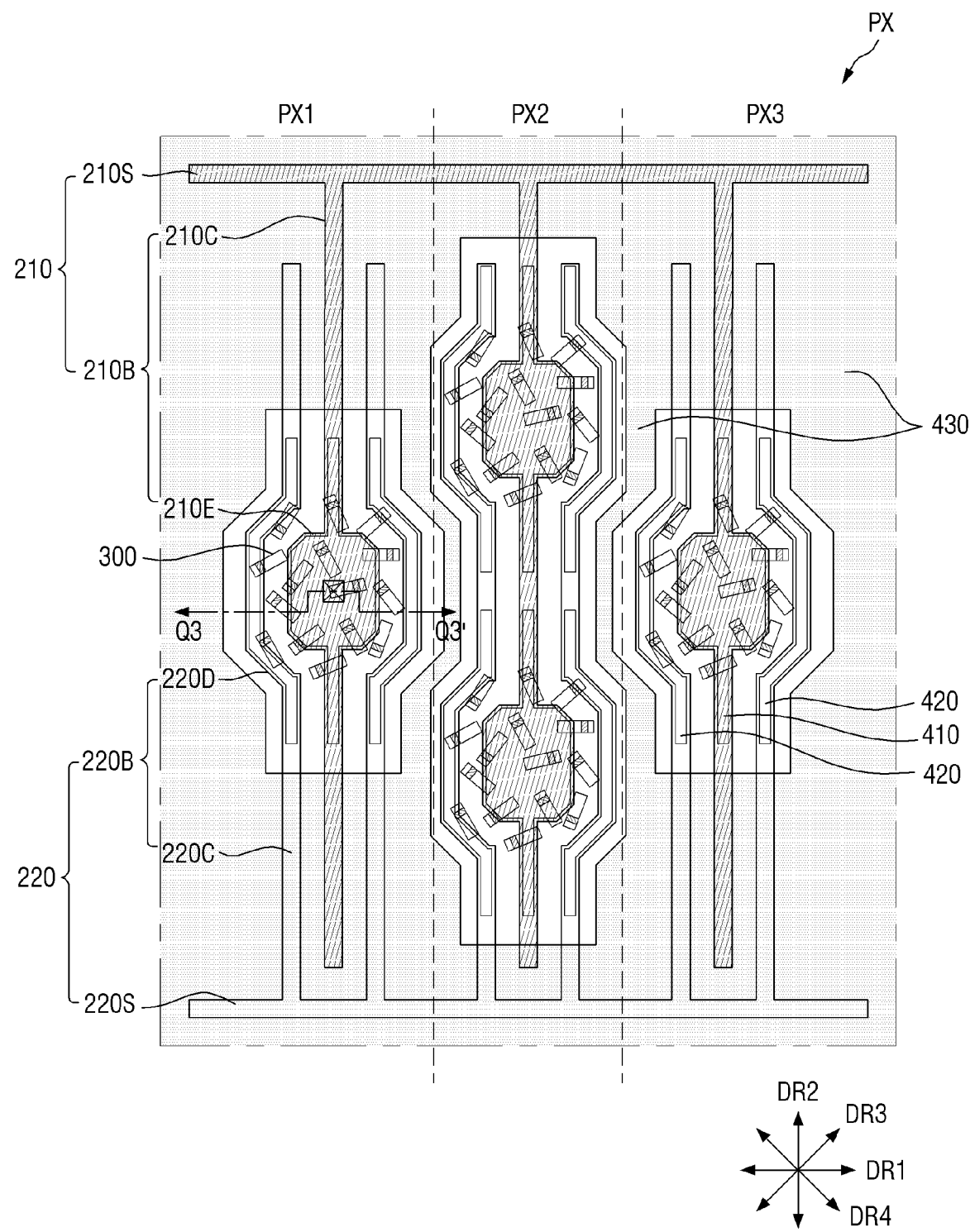
Figure 11:
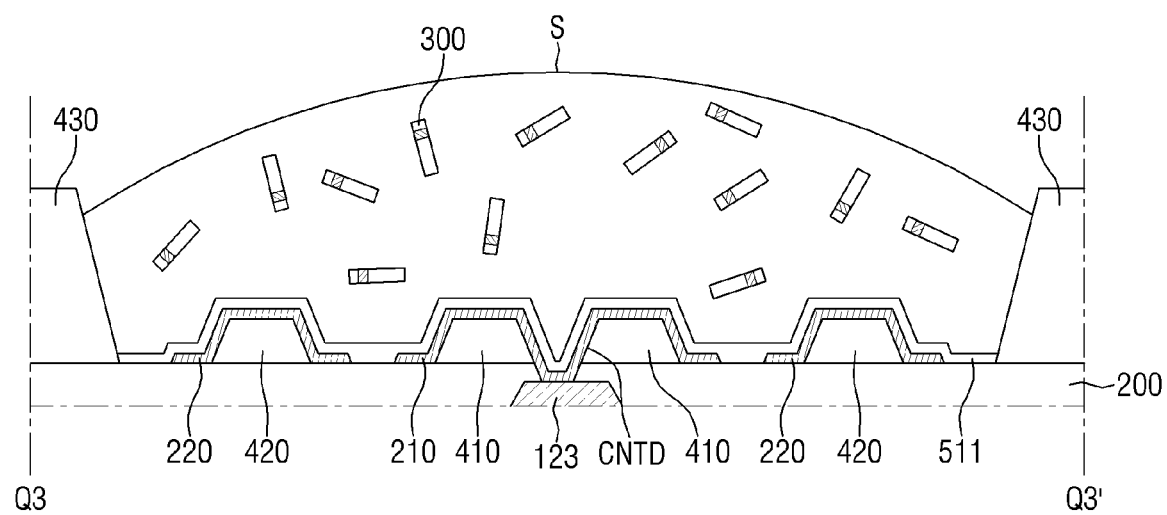

Referring to FIGS. 10 and 11, the solution S in which the light emitting elements 300 are dispersed is sprayed on the first insulating material layer 511. The method of spraying the solution S may be performed by using various processes, such as inkjet printing, inkjet injection, slot dye coating, and slot dye printing, but the present disclosure is not limited thereto. Steps of the first insulating material layer 511 may be formed due to the first partition wall 410, the second partition wall 420, and the third partition wall 430. For example, because the third partition wall 430 is formed to have a greater height, the light emitting elements 300 sprayed on the first insulating material layer 511 may be sprayed on the light emitting area LA surrounded by the third partition wall 430.

Figure 12:
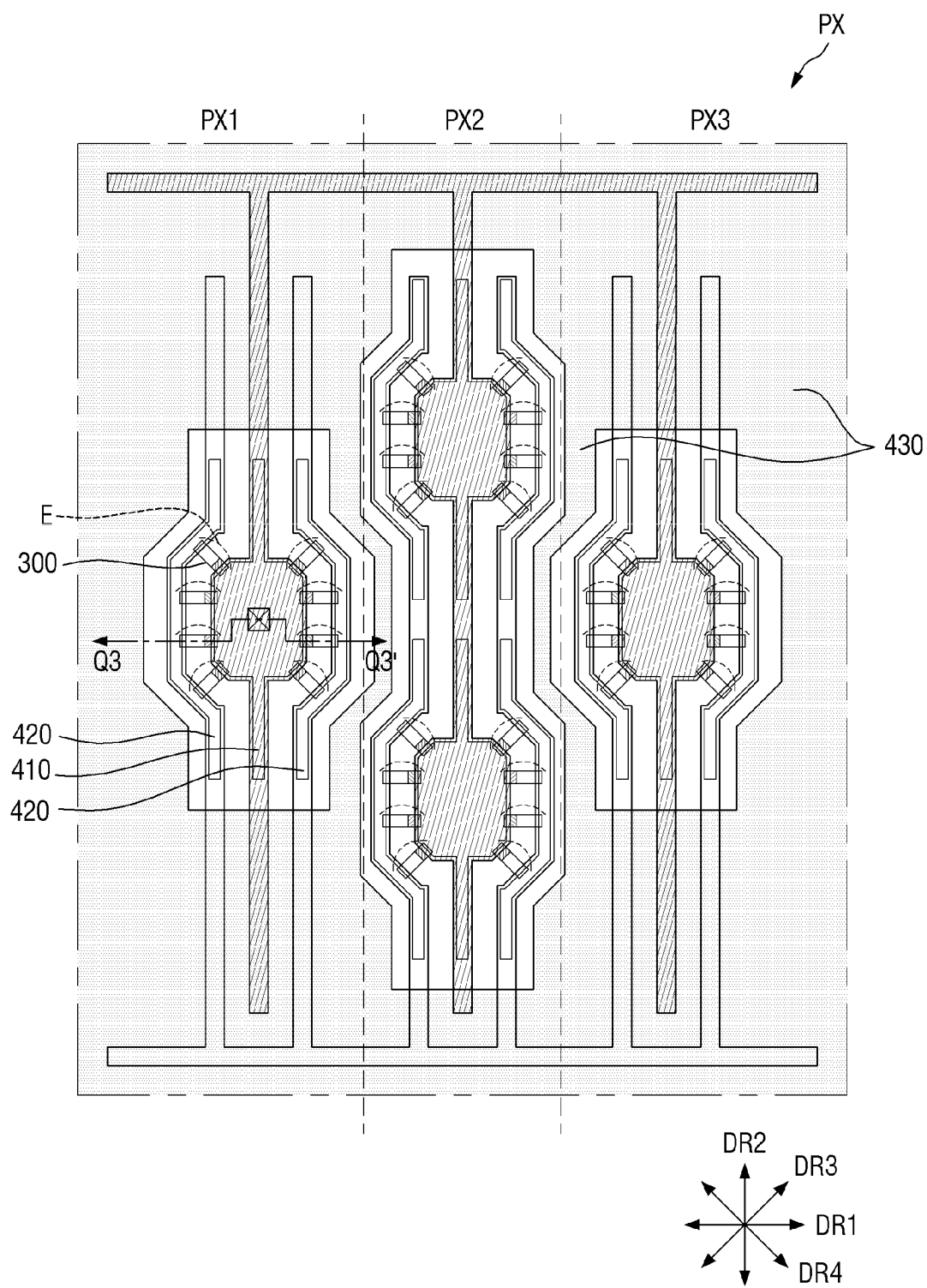
Figure 13:
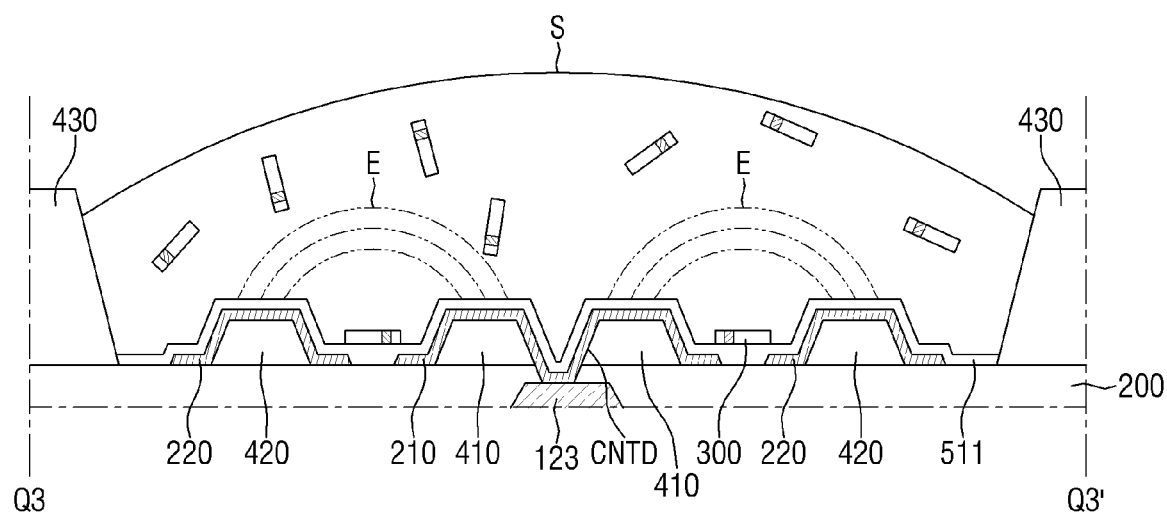

Next, referring to FIGS. 12 and 13, the first electrode 210 and the second electrode 220 applies an alignment signal to form an electric field E therebetween. One end of the light emitting element 300 may have a first polarity, and the other end thereof may have a second polarity that is different from the first polarity. When the light emitting elements 300 each having both ends of different polarities are placed in the electric field E, the alignment direction of the light emitting elements 300 may be controlled by electrical forces (attractive force and repulsive force).

When the electric field E is formed in the solution S sprayed on the first electrode 210 and the second electrode 220, the light emitting elements 300 may receive an electrical force by the electric field E, and the light emitting elements 300 may be arranged between the first electrode 210 and the second electrode 220 as a result of the electrical force. As shown in FIG. 13, the light emitting element 300 is located on the first insulating material layer 511 between the first electrode 210 and the second electrode 220.

Here, ends of the light emitting element 300 are located on the first electrode 210 and the second electrode 220, respectively. That is, one end of the light emitting element 300 may be located on the first electrode expansion portion 210E, and the other end thereof may be located on the second electrode bending portion 220D. As described above, the first electrode expansion portion 210E and the second electrode bending portion 220D may include a plurality of electrode surfaces ES extending in different directions, and the light emitting elements 300 may be aligned to have different domains DM in the light emitting area LA.

Figure 14:
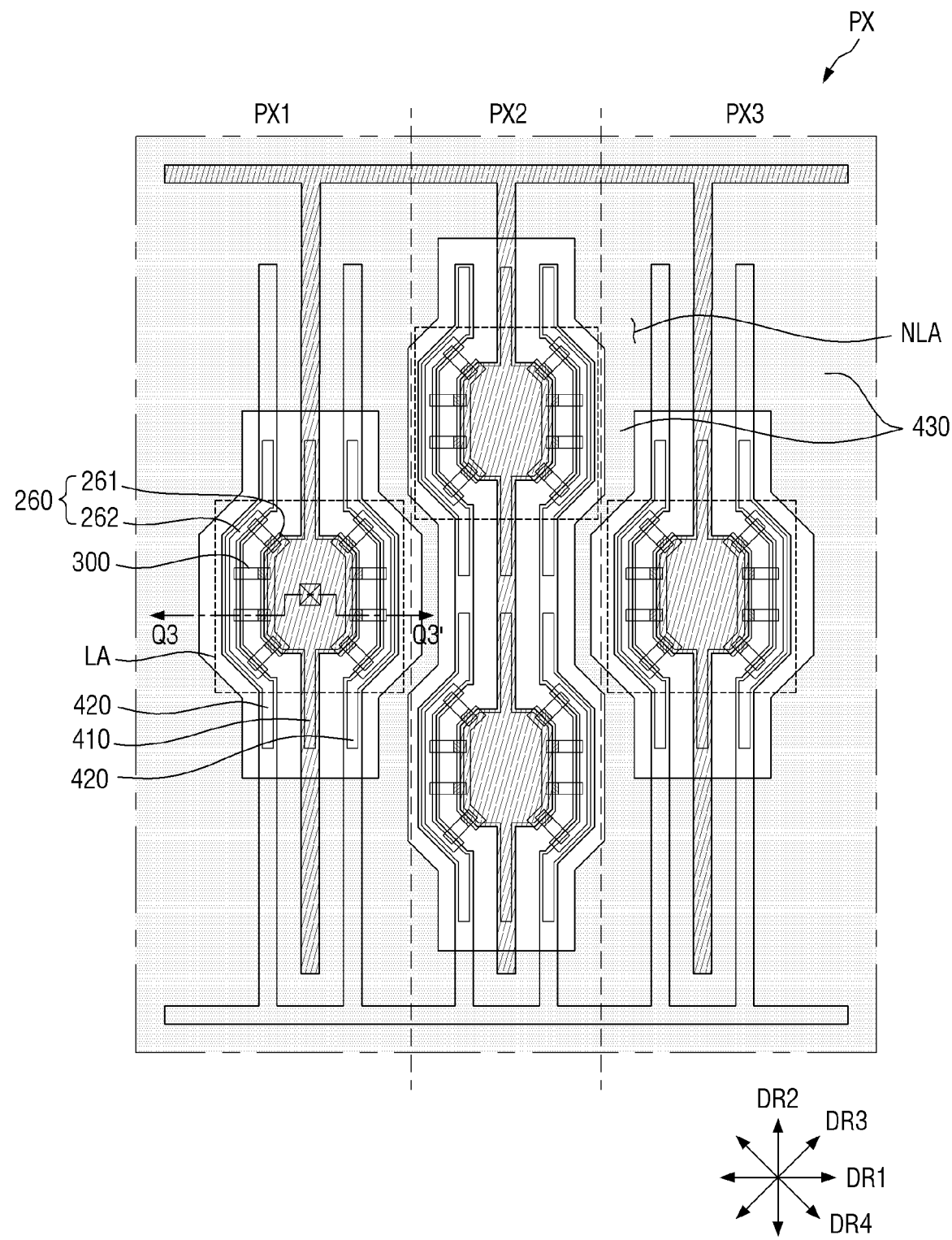
Figure 15:
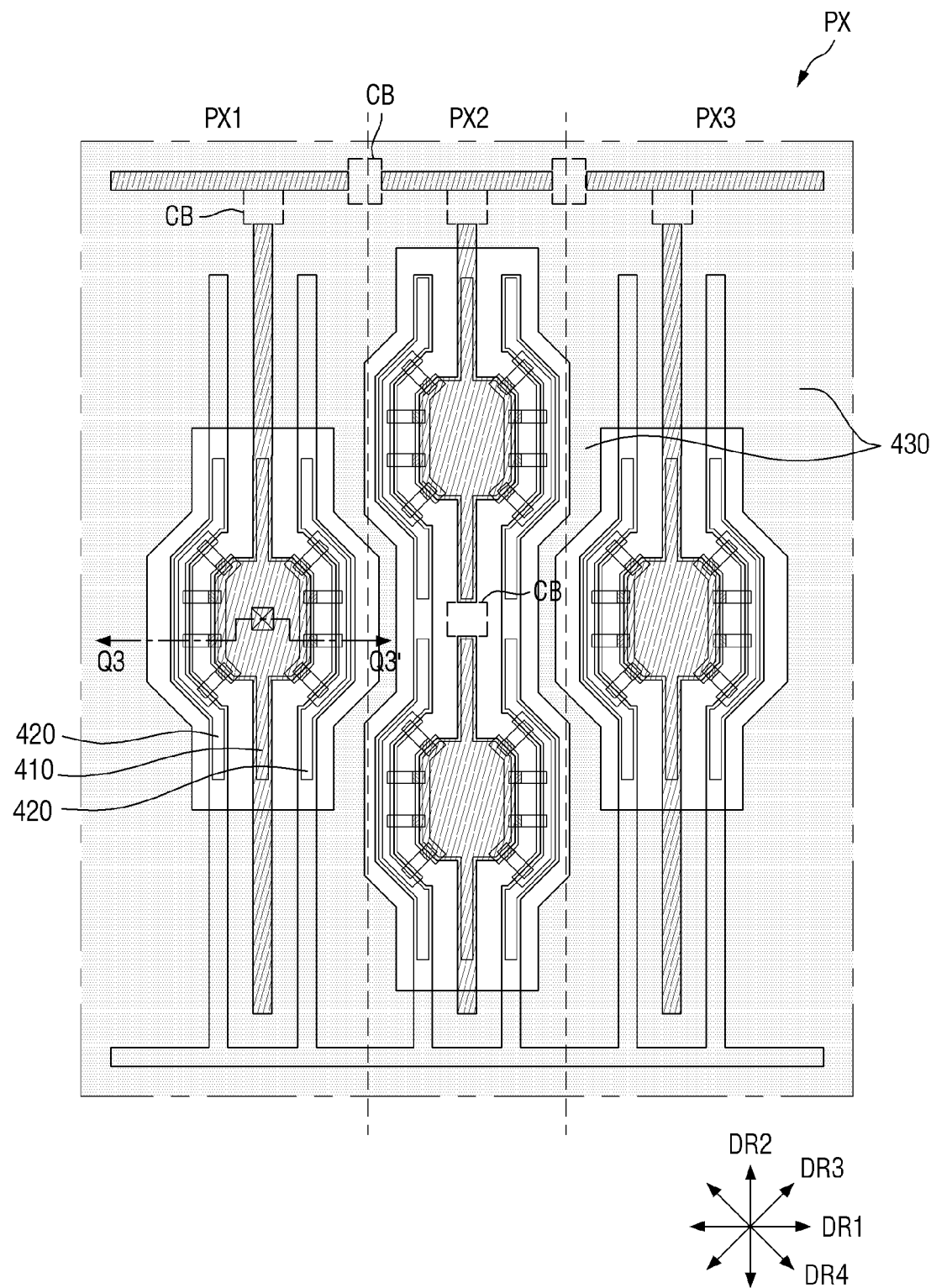

Next, referring to FIG. 14, at least a portion of the first insulating material layer 511 is patterned to form a first insulating layer 510, and a second insulating layer 520 and a contact electrode 260 is formed on the first insulating layer 510. The description of these structures is the same as that mentioned above. Finally, referring to FIG. 15, a portion of the first electrode 210 and a portion of the second electrode 220 are cut along a cutting portion(s) CB to manufacture the display device 10 of FIG. 1.

Hereinafter, other embodiments of the display device 10 will be described.

Unlike in FIG. 1, the display device 10 may include a larger number of electrodes. A third electrode 230 and a fourth electrode 240 may be located between the first electrode 210 and the second electrode 220, and these electrodes may be alternately arranged with respect to the center of the first electrode expansion portion 210E. The third electrode 230 and the fourth electrode 240 may be substantially similar to any one of the first electrode branch 210B and the second electrode branch 220B. That is, the display device 10 effectively may further include another first electrode branch 210B spaced apart from the outside of the second electrode branch 220B of the display device 10 of FIG. 1 and facing the outside thereof, and may include another second electrode branch 220B spaced apart from the other first electrode branch 210B.

Figure 16:
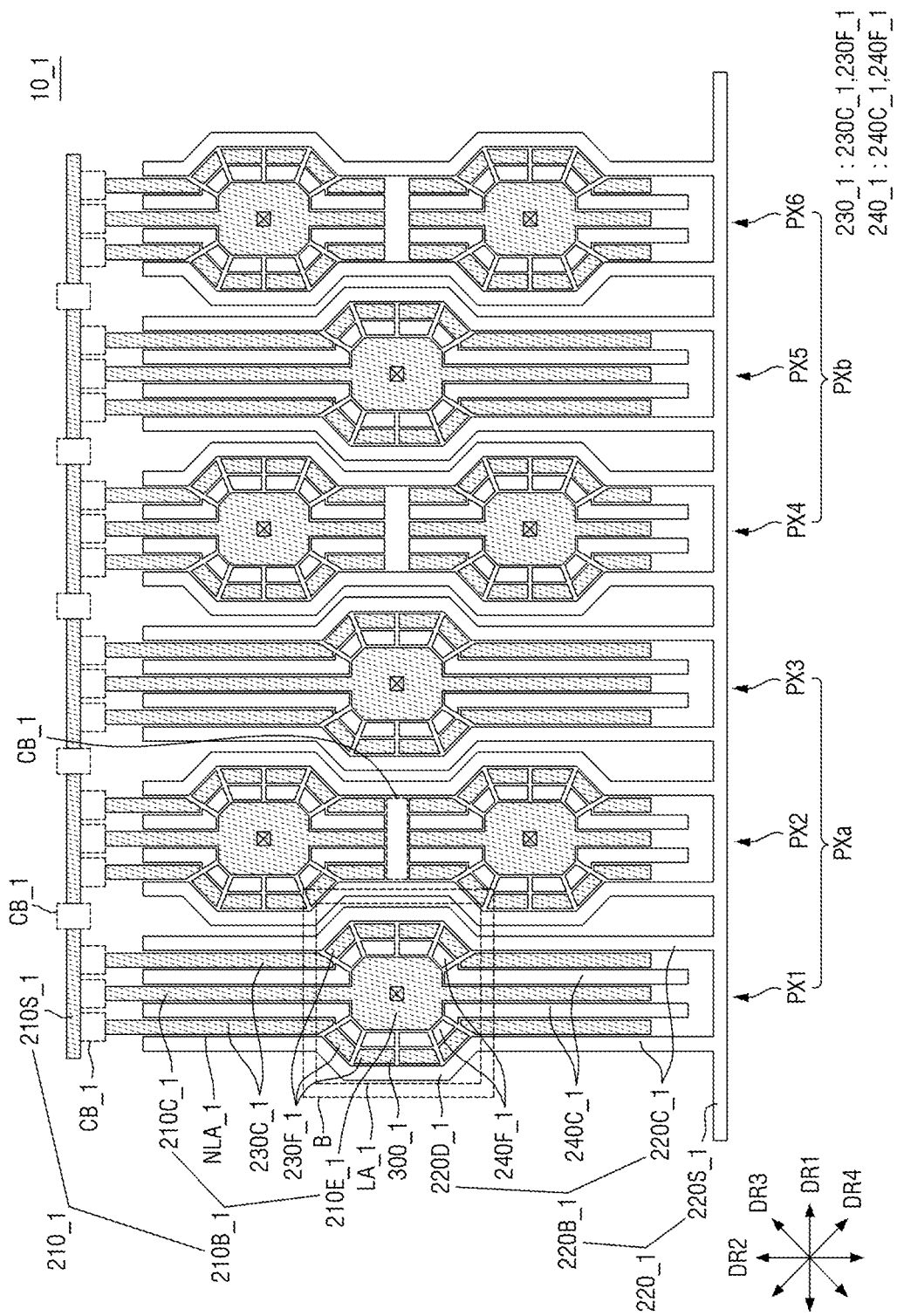
FIG. 16 is a plan view of a display device according to another embodiment.
Figure 17:
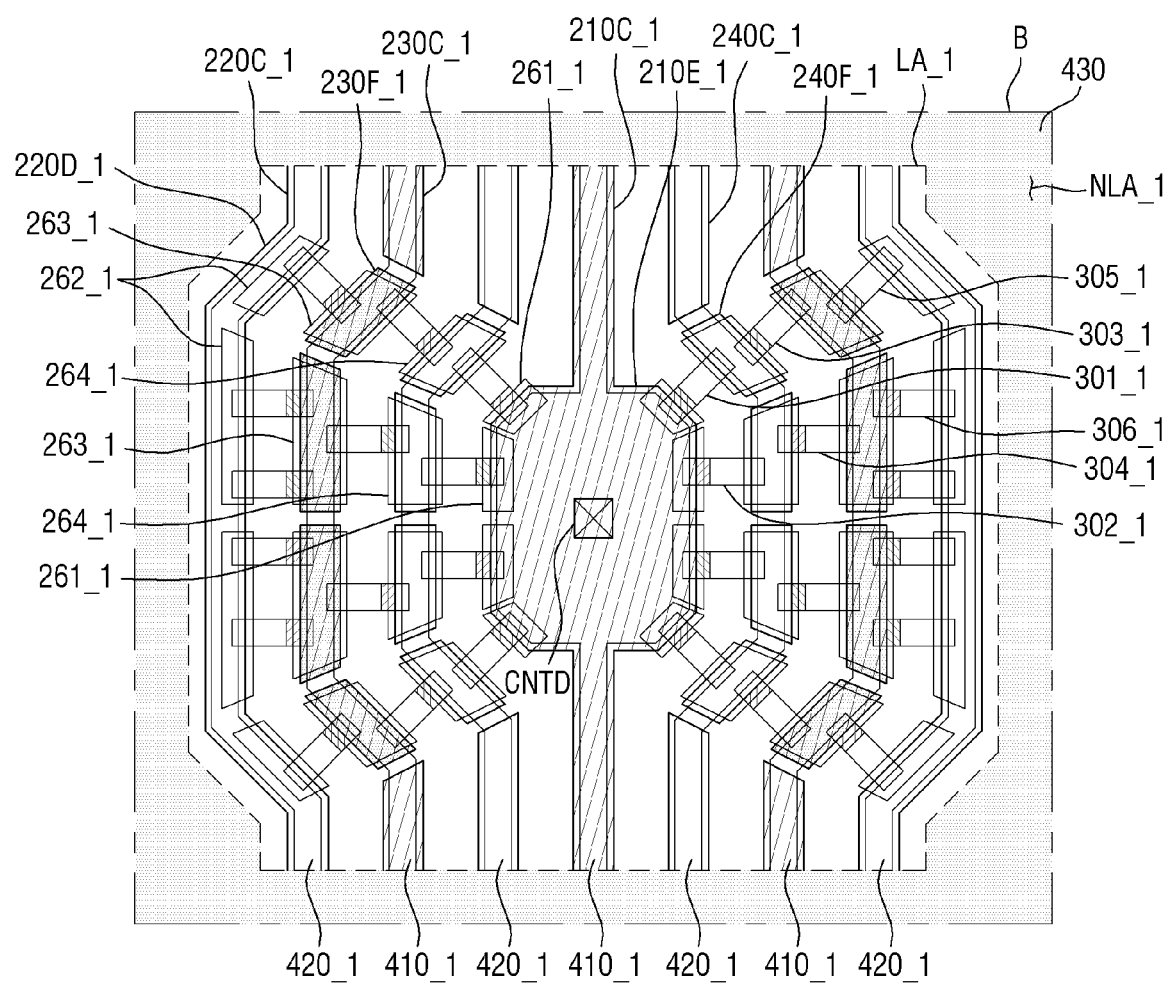
FIG. 17 is an enlarged view of the portion B of FIG. 16.

FIG. 16 is a plan view of a display device according to another embodiment, and FIG. 17 is an enlarged view of the portion B of FIG. 16.

Referring to FIGS. 16 and 17, a display device 10-1 according to another embodiment may further include a third electrode 230_1 and a fourth electrode 240_1 located between a first electrode branch 210B_1 and a second electrode branch 220B_1. The display device 10_1 of FIG. 16 is the same as the display device 10 of FIG. 1, except that the display device 10_1 of the present embodiment further includes two third electrodes 230_1 and two fourth electrodes 240_1. Hereinafter, redundant descriptions will be omitted, and the third electrode 230_1 and the fourth electrode 240_1 will be described in detail.

The display device 10-1 according to another embodiment may further include a third electrode 230_1 located between a first electrode expansion portion 210E_1 and a second electrode bending portion 220D_1, and may also include a fourth electrode 240_1 located between the third electrode 230_1 and the first electrode 210_1.

The third electrode 230_1 may include a third electrode extension portion 230C_1 extending in the second direction DR2, and a plurality of third electrode fragments 230F_1 bent according to the shape of the second electrode bending portion 220D_1 and spaced apart from each other in the second direction DR2. The third electrode 230_1 may have substantially the same shape as the second electrode branch portion 220B_1, and an area corresponding to the second electrode bending portion 220D_1 may be cut to form the plurality of third electrode fragments 230F_1. Although it is shown in the drawings that four third electrode fragments 230F_1 are formed, the present disclosure is not limited thereto.

The third electrode 230_1 may be substantially similar to any one of the first electrode branches 210B_1. In an embodiment, the first electrode 210_1 may include a plurality of first electrode branches 210B_1, any one of the first electrode branches 210B_1 may include a first electrode expansion portion 210E_1 and a first electrode extension portion 210C_1, and others of the first electrode branches 210B_1 may form the third electrode extension portion 230C_1 and the third electrode fragments 230F_1. That is, during the process of manufacturing the display device 10_1, like the first electrode branch 210B_1, the third electrode 230_1 may be branched from the first electrode stem 210S, may be disconnected along a cutting portion CB_1, and may then be additionally disconnected at respective portions to form the plurality of third electrode fragments 230F_1.

The third electrode extension portion 230C_1 may be spaced apart from the second electrode extension portion 220C_1 and may face the second electrode extension portion 220C_1. The third electrode extension portion 230C_1 may also extend in the second direction DR2, and may be located in the non-light emitting area NLA. The third electrode fragment 230F_1 may be spaced apart from the second electrode bending portion 220D_1 and may face the second electrode bending portion 220D_1. In some embodiments, the third electrode fragment 230F_1 may include an electrode surface spaced apart from the electrode surface ES of the second electrode bending portion 220D_1 and facing the electrode surface ES thereof. The third electrode fragment 230F_1 may have substantially the same shape as the second electrode bending portion 220D_1, and some regions of the third electrode fragment 230F_1 may be disconnected to be spaced apart from each other.

The fourth electrode 240_1 may include a fourth electrode extension portion 240C_1 extending in the second direction DR2, and a plurality of fourth electrode fragments 240F_1 that are bent according to the shape of the first electrode expansion portion 210E_1, and that are spaced apart from each other in the second direction DR2. The fourth electrode 240_1 may have substantially the same shape as the second electrode branch portion 220B_1, and an area corresponding to the second electrode bending portion 220D_1 may be cut to form the plurality of fourth electrode fragments 240F_1. Although it is shown in the drawings that four fourth electrode fragments 240F_1 are formed, the present disclosure is not limited thereto. For example, the fourth electrode 240_1 may have the same shape as the third electrode 230_1, and may be located between the third electrode 230_1 and the first electrode branch 210B_1.

The fourth electrode 240_1 may be substantially similar to any one of the second electrode branches 220B_1. In an embodiment, the second electrode 220_1 may include a plurality of second electrode branches 220B_1, the two second electrode branches 220B_1 may include a second electrode bending portion 220D_1 and a second electrode extension portion 220C_1, and other second electrode branches 220B_1 may form the fourth electrode extension portion 240C_1 and the fourth electrode fragments 240F_1. That is, during the process of manufacturing the display device 10_1, like the second electrode branch 220B_1, the fourth electrode 240_1 may be branched from the second electrode stem 220S, may be disconnected along the cutting portion CB_1, and may be then additionally disconnected to form the four fourth electrode fragments 240F_1.

The fourth electrode extension portion 240C_1 may be spaced apart from the first electrode extension portion 210C_1 and may face the first electrode extension portion 210C_1. The fourth electrode extension portion 240C_1 may also extend in the second direction DR2 and may be located in the non-light emitting area NLA. The fourth electrode fragment 240F_1 may be spaced apart from the first electrode expansion portion 210E_1 and may face the first electrode expansion portion 210E_1. In some embodiments, the fourth electrode fragment 240F_1 may include an electrode surface spaced apart from the electrode surface ES of the first electrode expansion portion 210E_1 and facing the electrode surface ES thereof.

That is, the third electrode 230_1 and the fourth electrode 240_1 may be floating electrodes in which branches that are branched from the first electrode stem 210S_1 and the second electrode stem 220S_1 are disconnected along the cutting portion(s) CB_1.

The display device 10_1 according to an embodiment may include a plurality of light emitting elements 300_1 located between the first electrode expansion portion 210E_1 and the fourth electrode fragment 240F_1, between the fourth electrode fragment 240F_1 and the third electrode fragment 230F_1, and between the third electrode fragment 230F_1 and the second electrode bending portion 220D_1. The display device 10_1 may further include a third contact electrode 263_1 and a fourth contact electrode 264_1 located on the third electrode fragment 230F_1 and the fourth electrode fragment 240F_1.

For example, as shown in FIG. 17, a first light emitting element 301_1 and a second light emitting element 302_1 may be located between the first electrode expansion portion 210E_1 and the fourth fragment 240F_1, a third light emitting element 303_1 and a fourth light emitting element 304_1 may be located between the fourth electrode fragment 240F_1 and the third electrode fragment 230F_1, and a fifth light emitting element 305_1 and a sixth light emitting element 306_1 may be located between the third electrode fragment 230F_1 and the second electrode bending portion 220D_1.

In the display device 10_1, the area where the light emitting elements 300_1 are located, that is, the area among the electrodes 210_1, 220_1, 230_1, and 240_1 increases, thereby increasing the number of the light emitting elements 300_1 per unit area. Accordingly, the display device 10_1 can improve the light emission efficiency per unit area.

Meanwhile, the first light emitting element 301_1, the third light emitting element 303_1, and the fifth light emitting element 305_1 may have long axes oriented toward the third direction DR3, and the second light emitting element 302_1, the fourth light emitting element 304_1, and the sixth light emitting element 306_1 may have long axes oriented toward the first direction DR1. That is, as described above, the display device 10_1 may include light emitting elements 300_1 having different alignment directions for each domain DM of the light emitting area LA_1, and thus the visibility of the display device 10_1 can be improved.

Further, because the third electrode fragment 230F_1 and the fourth electrode fragment 240F_1 are spaced apart from each other, one contact electrode may be located for each of the electrode fragments 230F_1 and 240F_1.

For example, the plurality of third electrode fragments 230F_1 and the plurality of fourth electrode fragments 240F_1 are respectively spaced apart from each other, and the plurality of third contact electrodes 263_1 may be in contact with one end of the third light emitting element 303_1 or the fourth light emitting element 304_1 and the third electrode fragment 230F_1. The plurality of fourth contact electrodes 264_1 may be in contact with the other end of the third light emitting element 303_1 or the fourth light emitting element 304_1 and the fourth electrode fragment 240F_1. Here, the plurality of third contact electrodes 263_1 and the plurality of fourth contact electrodes 264_1 may be respectively spaced apart from each other in one direction, for example, the second direction DR2.

In this case, the third light emitting element 303_1 and fourth light emitting element 304_1 of the display device 10_1 may be electrically connected in parallel to each other, and the third light emitting element 303_1 may be electrically connected in series to the first light emitting element 301_1 and the fifth light emitting element 305_1. Accordingly, unlike the display device 10 of FIG. 1, in the display device 10_1 of FIG. 16, the plurality of light emitting elements 300_1 are connected in series or in parallel, thereby further improving light emission efficiency per unit area.

According to the embodiments, because the light emitting elements may have various alignment directions in the light emitting area of the display device, the display device may improve visibility in each direction.

Further, because the display device further includes a plurality of floating electrodes located between the first electrode and the second electrode, the light emitting elements between the floating electrodes are connected in series to each other, thereby improving the light emission efficiency per unit area.

In concluding the detailed description, those skilled in the art will appreciate that many variations and modifications can be made to the disclosed embodiments without substantially departing from the principles of the present disclosure. Therefore, the disclosed embodiments of the invention are used in a generic and descriptive sense only and not for purposes of limitation.

What is claimed is:

1. A display device, comprising:
   a first electrode comprising a first electrode surface extending in a first direction and a second electrode surface connected to one end of the first electrode surface and extending in a second direction that is different from the first direction;
   a second electrode comprising a third electrode surface extending in the first direction and spaced apart from the first electrode surface and facing the first electrode surface, and a fourth electrode surface extending in the second direction and spaced apart from the second electrode surface and facing the second electrode surface; and
   at least one light emitting element between the first electrode and the second electrode and comprising a first light emitting element between the first electrode surface and the third electrode surface and a second light emitting element between the second electrode surface and the fourth electrode surface.

2. The display device of claim 1, wherein the light emitting element has a shape extending in one direction, and
   wherein a first angle, which is an acute angle between a long axis of the first light emitting element and the first direction, is different from a second angle, which is an acute angle between a long axis of the second light emitting element and the first direction.

3. The display device of claim 2, wherein the first angle is greater than the second angle.

4. The display device of claim 2, wherein the first electrode further comprises a fifth surface that is connected to the other end of the first electrode surface and that extends in a third direction that is different from the first direction and the second direction,
- wherein the second electrode further comprises a sixth surface that is connected to the other end of the third electrode surface, that extends in the third direction, that is spaced apart from the fifth surface, and that faces the fifth surface, and
- wherein the light emitting element further comprises a third light emitting element between the fifth surface and the sixth surface.

5. The display device of claim 4, wherein a third angle, which is an acute angle between a long axis of the third light emitting element and the first direction, is smaller than the first angle.

6. The display device of claim 5, wherein directions of the long axes of the first light emitting element, the second light emitting element, and the third light emitting element cross each other.

7. The display device of claim 1, further comprising:
- a first contact electrode contacting one end of the first light emitting element and the first electrode surface of the first electrode; and
- a second contact electrode contacting the other end of the first light emitting element and the third electrode surface of the second electrode.

8. The display device of claim 7, wherein the first contact electrode extends from a portion in which the first electrode surface is connected to the second electrode surface in the second direction to be in contact with the second electrode surface and one end of the second light emitting element.

9. The display device of claim 8, wherein the third electrode surface of the second electrode is connected to the fourth electrode surface of the second electrode, and
- the second contact electrode extends from a portion in which the third electrode surface is connected to the fourth electrode surface in the second direction to be in contact with the fourth electrode surface and the other end of the second light emitting element.

10. The display device of claim 7, wherein the second electrode comprises:
- a first fragment comprising the third electrode surface; and
- a second fragment spaced apart from the first fragment and comprising the fourth electrode surface.

11. The display device of claim 10, further comprising:
- a third contact electrode contacting one end of the second light emitting element and the second electrode surface of the first electrode; and
- a fourth contact electrode contacting the other end of the second light emitting element and the fourth electrode surface of the second fragment.

12. A display device, comprising:
- a first electrode comprising a first electrode extension portion extending in a first direction, and a first electrode expansion portion formed by expanding at least a portion of the first electrode extension portion;
- a second electrode comprising a second electrode extension portion extending in the first direction to be spaced apart from the first electrode extension portion and to face the first electrode extension portion, and a second electrode bending portion formed by bending at least a portion of the second electrode extension portion to be spaced apart from the first electrode expansion portion and to face the first electrode expansion portion; and
- at least one light emitting element between the first electrode expansion portion and the second electrode bending portion, and having a shape such that a direction of a long axis of the at least one light emitting element crosses a direction of a long axis of another light emitting element.

13. The display device of claim 12, wherein the first electrode expansion portion comprises a first electrode surface extending in the first direction, and a second electrode surface extending in a second direction that is different from the first direction,
- wherein the second electrode bending portion comprises a third electrode surface spaced apart from the first electrode surface and facing the first electrode surface, and a fourth electrode surface spaced apart from the second electrode surface and facing the second electrode surface, and
- wherein the at least one light emitting element comprises a first light emitting element between the first electrode surface and the third electrode surface, and a second light emitting element between the second electrode surface and the fourth electrode surface.

14. The display device of claim 13, further comprising:
- a first contact electrode contacting the first electrode expansion portion and one end of the first light emitting element; and
- a second contact electrode contacting the second electrode bending portion and the other end of the first light emitting element.

15. The display device of claim 13, further comprising:
- a third electrode between the first electrode expansion portion and the second electrode bending portion; and
- a fourth electrode between the third electrode and the second electrode bending portion,
- wherein the third electrode comprises a plurality of third electrode fragments spaced apart from each other in the first direction, and
- wherein the fourth electrode comprises a plurality of fourth electrode fragments spaced apart from each other in the first direction.

16. The display device of claim 15, wherein the light emitting element comprises:
- a third light emitting element between the first electrode expansion portion and one of the third electrode fragments;
- a fourth light emitting element between the third electrode fragment and one of the fourth electrode fragments; and
- a fifth light emitting element between the fourth electrode fragment and the second electrode bending portion.

17. The display device of claim 15, wherein the third electrode fragments comprise a first sub-fragment spaced apart from, and facing, the first electrode surface of the first electrode expansion portion, and a second sub-fragment spaced apart from, and facing, the second electrode surface, and
- wherein the at least one light emitting element comprises a sixth light emitting element between the first electrode surface and the first sub-fragment, and a seventh light emitting element between the second electrode surface and the second sub-fragment.

18. The display device of claim 17, further comprising:
- a third contact electrode contacting the first sub-fragment and one end of the sixth light emitting element; and
- a fourth contact electrode contacting the second sub-fragment and one end of the seventh light emitting element,
- wherein the third contact electrode is spaced apart from the fourth contact electrode in the first direction.

19. A display device, comprising:
a plurality of pixels in each which at least one light emitting area is defined, and comprising:
- a first electrode comprising a first electrode extension portion extending in a first direction, and a first electrode expansion portion formed by expanding at least a portion of the first electrode extension portion;
- a second electrode comprising a second electrode extension portion extending in the first direction to be spaced apart from, and to face, the first electrode extension portion, and a second electrode bending portion formed by bending at least a portion of the second electrode extension portion to be spaced apart from, and to face, the first electrode expansion portion; and
- a first light emitting element and a second light emitting element between the first electrode expansion portion and the second electrode bending portion, and each having a long axis respectively extending in directions crossing each other, wherein the plurality of pixels comprise:
- a first pixel comprising a first light emitting area; and
- a second pixel adjacent to the first pixel and comprising a second light emitting area and a third light emitting area spaced apart from each other in the first direction.

20. The display device of claim 19, wherein the second electrode comprises a second electrode stem extending in a second direction crossing the first direction,
wherein the second electrode extension portions of the first light emitting area and the second light emitting area are branched from the second electrode stem, and
wherein the second electrode extension portions of the second light emitting area and the third light emitting area are connected to each other.

21. The display device of claim 19,
wherein the first electrode expansion portion comprises a first electrode surface extending in the first direction and a second electrode surface extending in a second direction that is different from the first direction,
wherein the second electrode bending portion comprises a third electrode surface facing the first electrode surface and a fourth electrode surface facing the second electrode surface, and
wherein the at least one light emitting element comprises a first light emitting element between the first electrode surface and the third electrode surface and a second light emitting element between the second electrode surface and the fourth electrode surface.

22. The display device of claim 21, further comprising:
a partition wall surrounding the light emitting area of each of the pixels and comprising an opening area exposing the light emitting area,
wherein the second electrode extension portion and the second electrode bending portion may be disposed between the first electrode and the partition wall.

23. The display device of claim 22,
wherein the partition wall may be disposed between the neighboring pixels, and comprises a partition wall extension portion extending in the first direction and corresponding to the first electrode surface of the first electrode expansion portion and a partition wall bending portion extending in the second direction and corresponding to the second electrode surface of the first electrode expansion portion.

24. The display device of claim 23,
wherein the partition wall extension portion and the partition wall bending portion are disposed between the second light emitting area and third light emitting area of the second pixel and between the second light emitting area of the second pixel and the first light emitting area of the first pixel.

25. The display device of claim 23,
wherein the opening area comprises a first opening portion in which the first electrode extension portion is disposed, a second opening portion in which the first electrode expansion portion is disposed and a width of which in the second direction is greater than a width of the first opening portion in the second direction, and a third opening portion which connects the first portion and the second opening portion and a width of which becomes narrower along the first direction, and
the partition wall extension portion is disposed corresponding to the second opening portion of the opening area, and the partition wall bending portion may be disposed corresponding to the third opening portion of the opening area.

26. The display device of claim 25,
wherein the partition wall comprises a first opening area exposing the first light emitting area of the first pixel and a second opening area exposing the second light emitting area and third light emitting area of the second pixel, and
the first opening area comprises one of the second opening portions, and the second opening area may include the plurality of second opening portions spaced apart from each other in the first direction.

27. The display device of claim 26,
wherein, in the plurality of pixels, the first pixels and the second pixels are alternately arranged along the second direction, and
the first opening areas and the second opening areas are also alternately arranged along the second direction.

* * * * *